(12) United States Patent
Shimoyama et al.

(10) Patent No.: US 10,593,909 B2
(45) Date of Patent: Mar. 17, 2020

(54) DISPLAY DEVICE INCLUDING LOWER ELECTRODES ISOLATED BY AN INSULATOR PORTION AND METHOD OF MANUFACTURING THE SAME

(71) Applicant: CANON KABUSHIKI KAISHA, Tokyo (JP)

(72) Inventors: Daisuke Shimoyama, Yamato (JP); Nobutaka Ukigaya, Yokohama (JP); Mariko Furuta, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/816,196

(22) Filed: Nov. 17, 2017

(65) Prior Publication Data

US 2018/0159080 A1 Jun. 7, 2018

(30) Foreign Application Priority Data

Dec. 7, 2016 (JP) .................................. 2016-237828

(51) Int. Cl.
*H01L 51/52* (2006.01)
*H01L 27/32* (2006.01)
*H01L 51/56* (2006.01)

(52) U.S. Cl.
CPC ........ *H01L 51/5271* (2013.01); *H01L 27/322* (2013.01); *H01L 51/5225* (2013.01);
(Continued)

(58) Field of Classification Search
CPC .. H01L 51/5253; H01L 51/53; H01L 27/3246
(Continued)

(56) References Cited

U.S. PATENT DOCUMENTS 8,393,930 B2 * 3/2013 Kang .................. H01L 51/5203
313/504
9,236,581 B2 1/2016 Kato et al.
(Continued)

FOREIGN PATENT DOCUMENTS

CN 103904006 A 7/2014
CN 104218062 A 12/2014
(Continued)

OTHER PUBLICATIONS

U.S. Appl. No. 15/816,371, filed Nov. 17, 2017, art unit 2811.
Office Action dated Sep. 9, 2019, in counterpart CN application No. 201711275516.7 (21 pages).

*Primary Examiner* — Lex H Malsawma
*Assistant Examiner* — Eric W Jones
(74) *Attorney, Agent, or Firm* — Venable LLP

(57) ABSTRACT

A display device is provided. The device comprises light emitting elements and a protection layer. The light emitting elements include lower electrodes isolated by an insulator portion, an organic layer including a light emitting layer arranged on the lower electrodes, and an upper electrode covering the organic layer. The insulator portion includes a first portion arranged on the lower electrodes, and a second portion arranged between the lower electrodes. The protection layer covers the upper electrode, and is provided with an isolating portion that is arranged over the second portion and has a refractive index different from the protection layer. A height of an upper surface of a portion of the upper electrode arranged under the isolating portion is lower than a height of an upper surface of a portion of the upper electrode arranged over the first portion.

17 Claims, 21 Drawing Sheets

(52) U.S. Cl.
CPC .......... *H01L 51/5253* (2013.01); *H01L 51/56* (2013.01); *H01L 27/3246* (2013.01); *H01L 2227/323* (2013.01)

(58) Field of Classification Search
USPC ...................................................... 257/40, 59
See application file for complete search history.

(56) References Cited

U.S. PATENT DOCUMENTS

| | | | |
|---|---|---|---|
| 9,853,192 B2 | 12/2017 | Huh et al. | |
| 2007/0181872 A1* | 8/2007 | Lee ..................... | H01L 27/3246 257/40 |
| 2010/0213827 A1* | 8/2010 | Yoshida .............. | H01L 27/3246 313/504 |
| 2012/0218173 A1* | 8/2012 | Ohta ................... | G02B 3/0056 345/76 |
| 2012/0248467 A1* | 10/2012 | Yokoyama .......... | H01L 27/3246 257/88 |
| 2014/0179041 A1* | 6/2014 | Huh .................. | H01L 21/67207 438/28 |
| 2015/0048328 A1* | 2/2015 | Kato .................. | H01L 51/5209 257/40 |
| 2017/0110683 A1* | 4/2017 | Koresawa ........... | H01L 51/5246 |

FOREIGN PATENT DOCUMENTS

| | | |
|---|---|---|
| JP | 2013-258021 A | 12/2013 |
| WO | 2015/151531 A1 | 10/2015 |

* cited by examiner

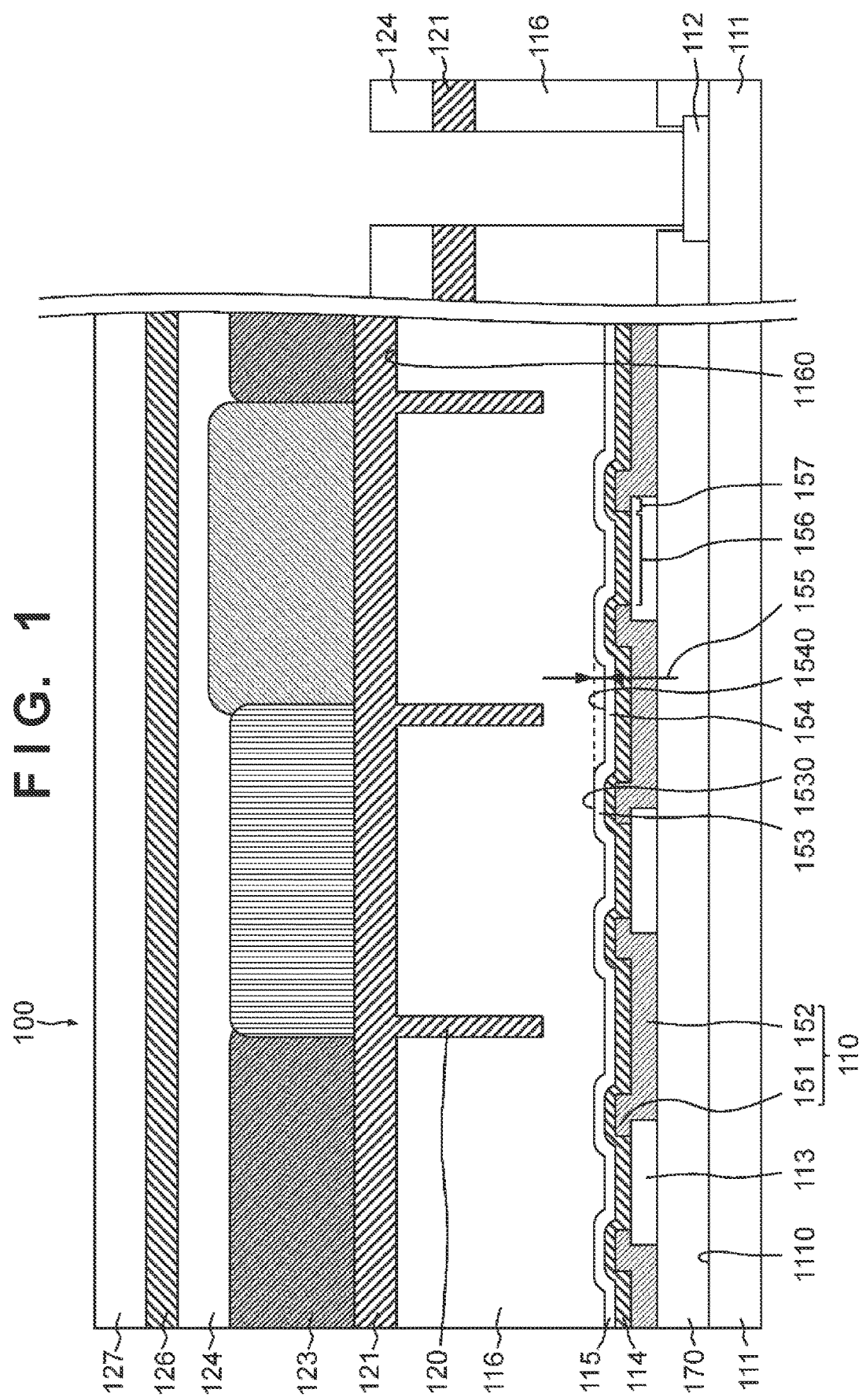

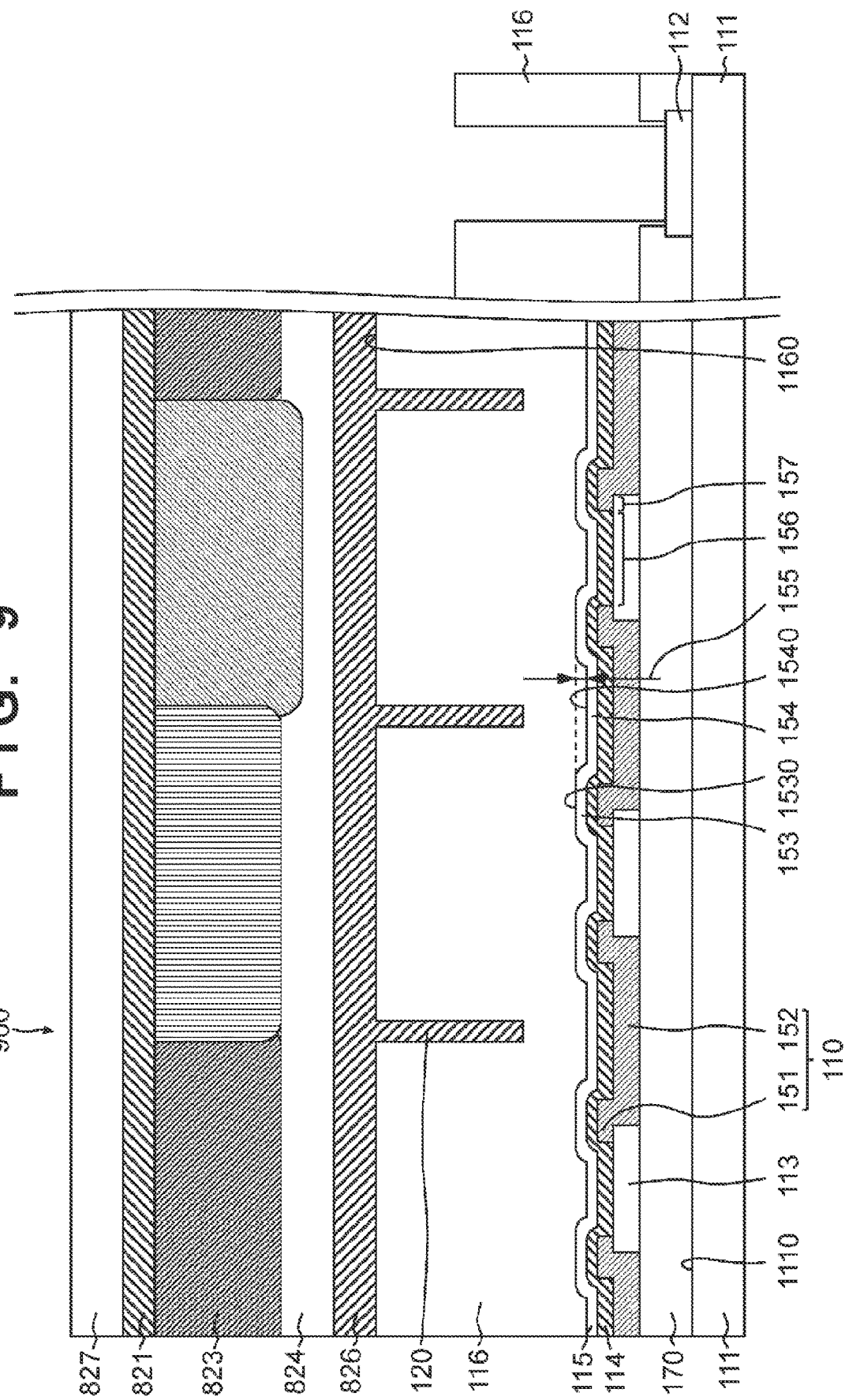

DISPLAY DEVICE INCLUDING LOWER ELECTRODES ISOLATED BY AN INSULATOR PORTION AND METHOD OF MANUFACTURING THE SAME

BACKGROUND OF THE INVENTION

Field of the Invention

The present invention relates to a display device and a method of manufacturing the same.

Description of the Related Art

A display device including a light emitting element using, as a light emitting layer, organic electroluminescence (EL) caused by an organic material that emits light has gained attention. Japanese Patent Laid-Open No. 2013-258021 discloses separating color filters arranged on a light emitting element from each other by a partition having a refractive index lower than that of the color filters. Even if light output from the light emitting layer obliquely strikes the color filters, the light is reflected by the interfaces between the color filters and the partitions, and color mixing caused by light leakage between adjacent light emitting elements is suppressed.

SUMMARY OF THE INVENTION

In the arrangement of the display device disclosed in Japanese Patent Laid-Open No. 2013-258021, the light output from the light emitting layer may diffuse in a protection layer arranged between the color filters and the light emitting layer to protect the light emitting layer from water in the atmosphere. If light leakage that diffuses light to adjacent light emitting elements occurs in the protection layer, the quality of a displayed image can lower.

Some embodiments of the present invention provide a technique of suppressing light leakage between adjacent light emitting elements in a display device.

According to some embodiments, a display device comprising: a substrate; light emitting elements arranged over a surface of the substrate; a protection layer arranged to cover the light emitting elements; and a color filter layer arranged above the protection layer, wherein the light emitting elements include lower electrodes isolated from each other by an insulator portion, an organic layer including a light emitting layer arranged on the lower electrodes, and the upper electrode arranged to cover the organic layer, the insulator portion includes a first portion arranged on each of the lower electrodes, and a second portion arranged between the lower electrodes, the protection layer is arranged to cover the upper electrode, the protection layer is provided with an isolating portion that is arranged over and overlapped with the second portion and has a refractive index different from that of the protection layer, and with respect to the surface of the substrate, a height of an upper surface of a portion of the upper electrode arranged under the isolating portion is lower than a height of an upper surface of a portion of the upper electrode arranged over the first portion, is provided.

According to some other embodiments, a display device comprising: a substrate; light emitting elements arranged over a surface of the substrate; a protection layer arranged to cover the light emitting elements; and a color filter layer arranged above the protection layer, wherein the light emitting elements include lower electrodes isolated from each other by an insulator portion, an organic layer including a light emitting layer arranged on the lower electrodes, and the upper electrode arranged to cover the organic layer, the protection layer includes an isolating portion provided over and overlapped with a portion between the plurality of lower electrodes, and the isolating portion is spaced apart from the upper electrode, is provided.

According to some other embodiments, a method of manufacturing a display device including light emitting elements, comprising: forming, over a surface of a substrate, lower electrodes isolated from each other by an insulator portion, an organic layer including a light emitting layer arranged on the lower electrodes, and an upper electrode arranged on a surface of the organic layer; forming a protection layer to cover the upper electrode; forming an isolating portion in the protection layer; and forming a color filter layer above the protection layer, wherein the insulator portion includes a first portion arranged on each of the lower electrodes, and a second portion arranged between the lower electrodes, the isolating portion is arranged on the second portion, and with respect to the surface of the substrate, a height of an upper surface of a portion of the upper electrode arranged under the isolating portion is lower than a height of an upper surface of a portion of the upper electrode arranged over the first portion, is provided.

Further features of the present invention will become apparent from the following description of exemplary embodiments (with reference to the attached drawings).

BRIEF DESCRIPTION OF THE DRAWINGS

FIG. 1 is a sectional view for explaining the arrangement of a display device according to an embodiment of the present invention;

FIG. 9 is a sectional view for explaining still another modification of the display device shown in FIG. 1;

DESCRIPTION OF THE EMBODIMENTS

Figure 2A:
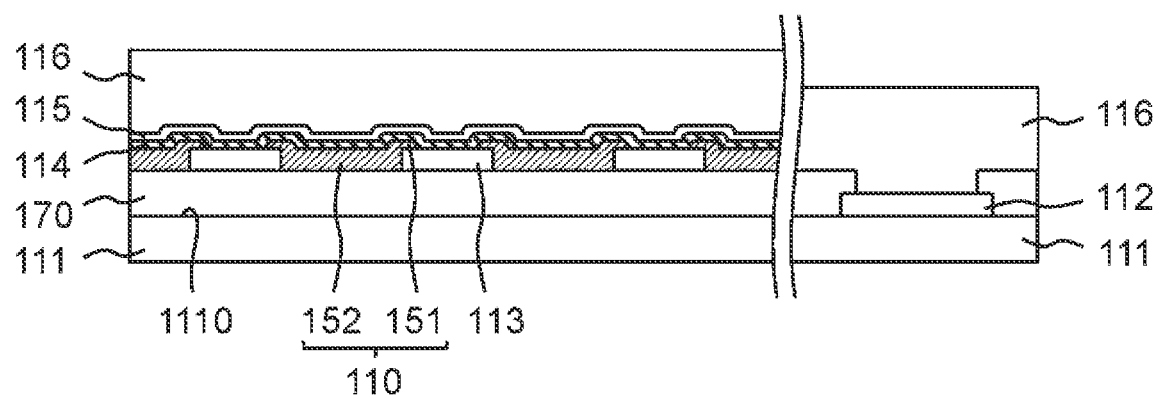
FIGS. 2A to 2E are sectional views for explaining a method of manufacturing the display device shown in FIG. 1.

Detailed embodiments of a display device and a method of manufacturing the display device according to the present invention will now be described with reference to the accompanying drawings. Note that in the following explanation and drawings, common reference numerals denote common components throughout a plurality of drawings. For this reason, the common components will be described by cross-referring to the plurality of drawings, and a description of components denoted by common references numeral will appropriately be omitted.

The arrangement of a display device and a method of manufacturing the display device according to an embodiment of the present invention will be described with reference to FIGS. 1 to 4D. FIG. 1 is a sectional view showing the arrangement of a display device 100 according to a first embodiment of the present invention. The display device 100 is used as an organic light emitting display including an organic light emitting element using, as a light emitting layer, an organic material that emits light.

Driving elements (not shown), wiring lines (not shown), and the like used to drive each light emitting element are formed on a surface 1110 of a substrate 111. As shown in FIG. 1, the substrate 111 with the driving elements, the wiring lines, and the like formed on it is covered with an interlayer dielectric film 170. The interlayer dielectric film 170 planarizes the surface 1110 of the substrate 111 with the driving elements and the wiring lines, and can present unwanted electrical connection between a light emitting portion and the driving element or wiring line. The substrate 111 can have two principal surfaces. In this embodiment, the surface on which the driving elements, the wiring lines, and the like are formed is called the surface 1110.

Light emitting elements (light emitting portion) each including an insulator portion 110, a lower electrode 113, an organic layer 114 including a light emitting layer, and an upper electrode 115 are arranged on the interlayer dielectric film 170. The insulator portion 110 and the lower electrodes 113 are arranged in contact with the interlayer dielectric film 170 on the substrate 111. The lower electrodes 113 are isolated by the insulator portion 110 in correspondence with the light emitting elements. The insulator portion 110 is formed to cover a peripheral portion 157 of each lower electrode 113 from the upper surface to the side surface, and includes a portion 151 arranged on the lower electrode 113 and a portion 152 arranged between the plurality of lower electrodes 113. The organic layer 114 including a light emitting layer using an organic material that exhibits electroluminescence is arranged on the lower electrodes 113. The upper electrode 115 is arranged on the organic layer 114. The lower electrode 113, the organic layer 114, and the upper electrode 115 form a light emitting element, and are formed in the image display region of the display device 100. In this embodiment, the organic layer 114 and the upper electrode 115 may be shared by a plurality of light emitting elements, as shown in FIG. 1. For example, the organic layer 114 and the upper electrode 115 each having an integral structure may cover the whole image display region of the display device 100. For this reason, each light emitting element can be defined by each of the plurality of lower electrodes 113 isolated by the insulator portion 110. In addition, one pixel can be formed by one or a plurality of light emitting elements.

A protection layer 116 configured to seal the organic layer 114 and protect it from water in the atmosphere is arranged on the light emitting portion with the plurality of light emitting elements so as to cover the upper electrode 115. The protection layer 116 is provided with an isolating portion 120 that suppresses entry of light from a light emitting element into another pixel. The isolating portion 120 can be formed to have, for example, a refractive index different from that of the protection layer 116. As shown in FIG. 1, the isolating portion 120 may include a trench structure arranged in an upper surface 1160 of the protection layer 116. In this case, the trench can extend from the upper surface 1160 of the protection layer 116 toward the substrate 111. The isolating portion 120 may have a structure embedded in the protection layer 116. The isolating portion 120 may be made of a material having a refractive index lower than that of the protection layer 116, may be a cavity, or may include a cavity. The isolating portion 120 may include a light shielding member.

In addition, with respect to the surface 1110 of the substrate 111, the height of an upper surface 1540 of a portion 154 of the upper electrode 115, which is arranged under the isolating portion 120, is lower than the height of an upper surface 1530 of a portion 153 of the upper electrode 115, which is arranged above the portion 151 of the insulator portion 110. The upper electrode 115 and the organic layer 114 arranged under the isolating portion 120 are thus spaced apart from the isolating portion 120, and the thickness of the protection layer 116 arranged between the isolating portion 120 and the upper electrode 115 can be increased. As a result, the upper electrode 115 and the organic layer 114 can be protected from water that enters via the isolating portion 120. As shown in FIG. 1, a step 155 exists between the upper surface 1540 of the portion 154 and the upper surface 1530 of the portion 153. On the protection layer 116, a planarization layer 121 is arranged in contact with the upper surface 1160 of the protection layer 116. As shown in FIG. 1, the planarization layer 121 may be continuously made of the same material as the isolating portion 120.

An example in which the insulator portion 110 has a concave portion between the lower electrodes 113, and the height of the upper surface of the upper electrode 115 changes accordingly has been described here. However, the insulator portion 110 may be planarized, and the upper surface of the upper electrode 115 may not have a concave portion between the lower electrodes 113. In this case as well, since the isolating portion 120 is spaced part from the organic layer 114 and the upper electrode 115, the upper electrode 115 and the organic layer 114 can be protected from water that enters via the isolating portion 120.

Color filter layers 123 configured to pass green, red, and blue light components are arranged on the planarization layer 121. In this embodiment, an example in which the light emitting layer included in the organic layer 114 emits white light will be described. However, the present invention is not limited to this. For example, the light emitting layer included in the organic layer 114 may emit light other than white light, and the color filter layers 123 may have structures to convert the light into color light. For example, each light emitting layer included in the organic layer 114 may emit green, red, or blue light, and the color filter layers 123 may be absent. Alternatively, the color filter layers 123 may pass not green, red, and blue light components but magenta, yellow, and cyan light components.

A protection film 124 that also functions as a planarization layer for reducing the unevenness on the color filter layers 123 is arranged on the color filter layers 123. A glass plate 127 is arranged on a bonding member 126 on the protection film 124. A peripheral region is arranged outside the display region of the display device 100. In the peripheral region, a pad electrode 112 configured to supply power or a signal from the outside to the display device 100, and the like are arranged on the substrate 111.

A method of manufacturing the display device 100 will be described next. First, the light emitting portion including the lower electrodes 113 provided for the plurality of light emitting elements, respectively, and the organic layer 114 and the upper electrode 115 which are shared by the plurality of light emitting elements is formed. The lower electrodes 113 are formed on the surface 1110 of the substrate 111 on which the interlayer dielectric film 170 that covers the driving elements (not shown), the wiring lines (not shown) and the like is formed. The lower electrodes 113 can be made of a material of high reflectance, for example, a metal such as aluminum or silver, an aluminum alloy, or a silver alloy. The lower electrodes 113 may each have a stacked structure.

Next, the insulator portion 110 is formed to isolate the lower electrodes 113 adjacent to each other. As for the insulator portion 110, for example, the material of the insulator portion 110 is deposited to cover the substrate 111 on which the lower electrodes 113 are formed. Then, a portion of the insulator portion 110 arranged on a center portion 156 of each lower electrode 113 is etched using a photolithography step or the like, thereby forming the insulator portion 110. Hence, the portion 151 covers the peripheral portion 157 of each of the plurality of lower electrodes 113 and does not cover the center portion 156 of each of the plurality of lower electrodes 113. It can also be said that each lower electrode 113 includes the peripheral portion 157 and the center portion 156 arranged inside the peripheral portion 157. The insulator portion 110 may be made of an inorganic material such as silicon oxynitride, silicon oxide, or silicon nitride, or may be made of an organic material such as acryl or polyimide.

After the lower electrodes 113 and the insulator portion 110 are formed, the organic layer 114 and the upper electrode 115 are formed. The organic layer 114 may have a stacked structure including at least one of a hole injection layer, a hole transport layer, an electron transport layer, and an electron injection layer in addition to a light emitting layer (luminescence layer). For the upper electrode 115, for example, a transparent conductive film such as ITO or IZO can be used. For the upper electrode 115, an alloy of silver and magnesium or an alloy of aluminum, sodium, calcium, or the like may be used.

Next, the protection layer 116 is formed to cover the upper surface of the upper electrode 115 of the light emitting portion. For the protection layer 116, for example, silicon nitride is used. The protection layer 116 has a film thickness of, for example, 1 µm or more to protect the organic layer 114 from water or the like. The formed protection layer 116 may cover the peripheral region where the pad electrode 112 is formed.

FIG. 2A is a sectional view after deposition of the protection layer 116. The step of forming the driving elements (not shown), the wiring lines (not shown), and the like on the substrate 111 before the formation of the lower electrodes 113 is omitted. For example, silicon is used for the substrate 111, and the driving elements, the wiring lines, and the like can be formed on the surface 1110 of the substrate 111 using a general CMOS forming process. Without using silicon for the substrate 111, an insulating substrate or conductive substrate may be used. In this case, a semiconductor layer of silicon or the like may be formed on the surface 1110 of the substrate 111, and the driving elements, the wiring lines, and the like may be formed on the semiconductor layer.

Figure 2B:
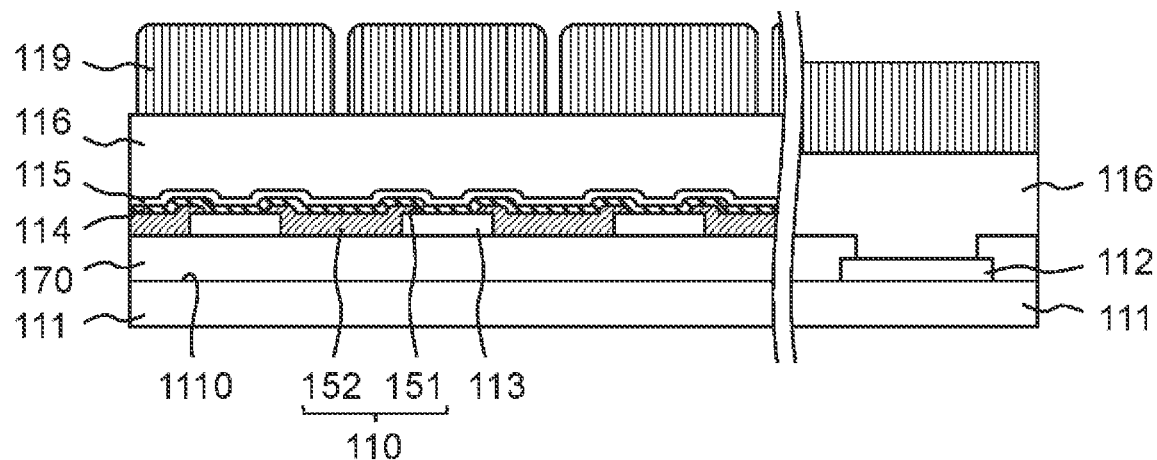

After the formation of the protection layer 116, a resist mask 119 is formed on the protection layer 116, as shown in FIG. 2B. The resist mask 119 can be formed using a photolithography step of, for example, coating the protection layer 116 with a photoresist using novolac resin or the like and then performing exposure and development. As shown in FIG. 2B, the resist mask 119 has openings in portions arranged above the portions 152 of the insulator portion 110.

Figure 2C:
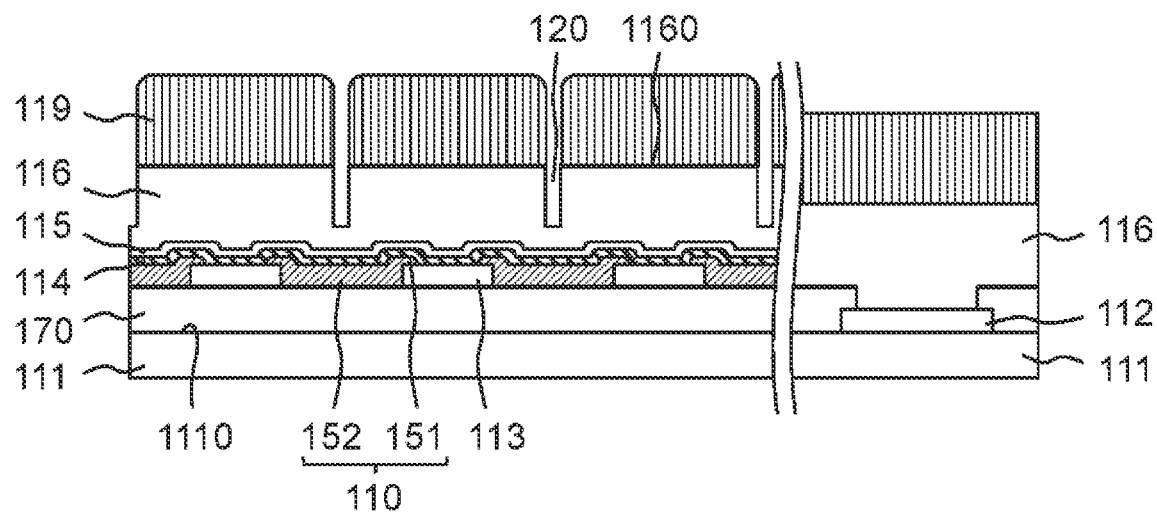

Next, as shown in FIG. 2C, an etching step of etching the protection layer 116 via the opening portions of the resist mask 119 using, for example, dry etching to form trenches that form the isolating portions 120 on the side of the upper surface 1160 of the protection layer 116 is performed. If the protection layer 116 is made of silicon nitride, the trenches that form the isolating portions 120 can be formed by dry etching using a gas such as $CF_4$ or $SF_6$. Since the isolating portions 120 can be entry routes of water to the organic layer 114, the side and bottom surfaces of the isolating portions 120 are not in contact with the organic layer 114. As shown in FIG. 2C, with respect to the surface 1110 of the substrate 111, the bottom surfaces of the isolating portions 120 may be within the height at which the protection layer 116 exists. In other words, the protection layer 116 may include a portion arranged between the isolating portions 120 and the upper electrode 115. When the isolating portions 120 are not in contact with the organic layer 114, and the protection layer 116 and the upper electrode 115 are arranged between the isolating portions 120 and the organic layer 114, the organic layer 114 is sealed and protected from water or the like.

Figure 2D:
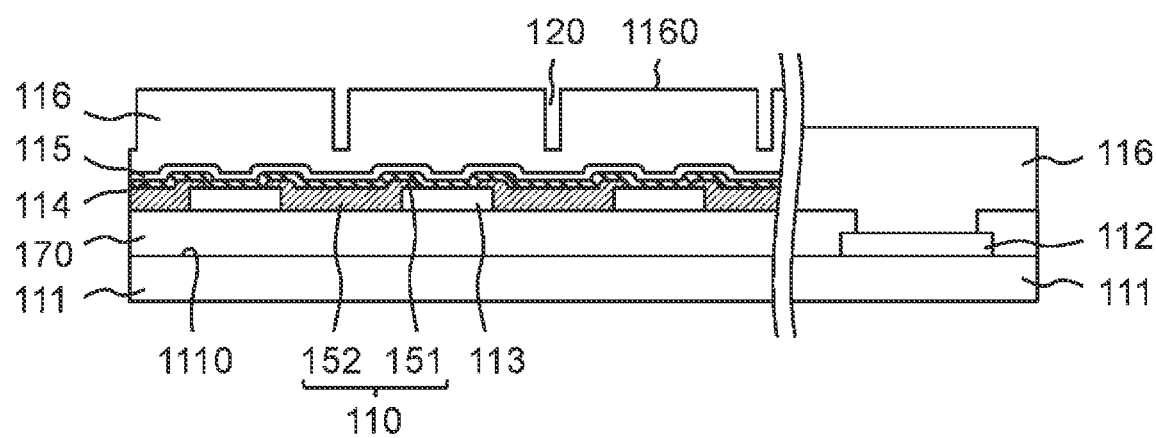

After the trenches that form the isolating portions 120 are formed by etching, the resist mask 119 is removed. The resist mask 119 can be removed by a wet process using a resist stripper, or a dry process such as dry etching using a gas such as oxygen or ozone containing oxygen molecules. When the resist mask 119 is removed, the trenches that form the isolating portions 120 are exposed to the portions of the protection layer 116 arranged on the portions 152 of the insulator portion 110, as shown in FIG. 2D. With the above step, the step 155 is formed between the upper surface 1540 of the portion 154 and the upper surface 1530 of the portion 153 of the upper electrode 115, as shown in FIG. 1. In addition, with respect to the surface 1110 of the substrate 111, the height of the upper surface 1540 of the portion 154 of the upper electrode 115, which is arranged under the isolating portion 120, becomes lower than the height of the upper surface 1530 of the portion 153 of the upper electrode 115, which is arranged above the portion 151 of the insulator portion 110.

Figure 2E:
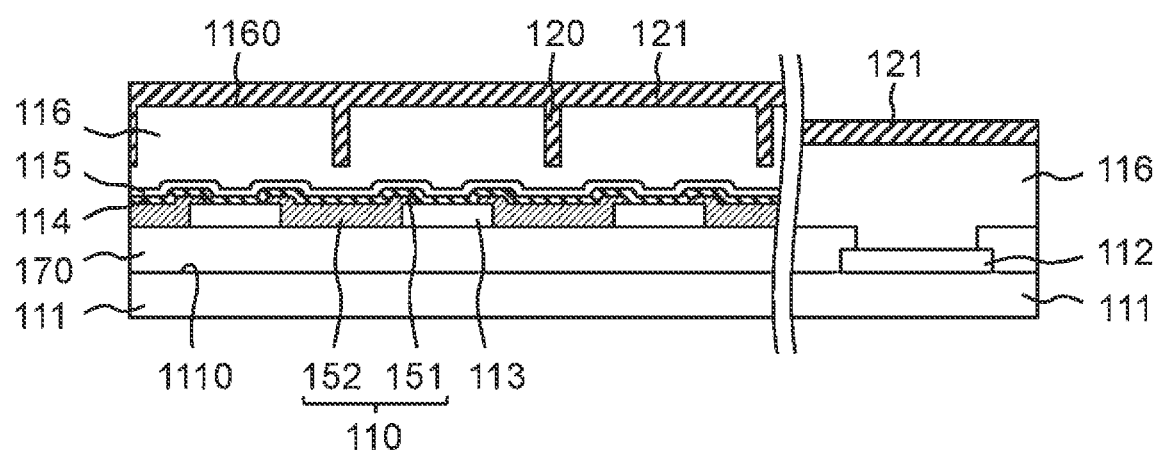

Next, the planarization layer 121 configured to suppress the unevenness on the upper surface 1160 of the protection layer 116 formed by the protection layer 116 and the isolating portions 120 is formed. The planarization layer 121 may be formed by coating the surface with an organic material such as acrylic resin using a spin coater or a slit coater and curing the resin. At this time, as shown in FIG. 2E, the material used for the planarization layer 121 may be embedded in the isolating portions 120 and used as the material of the isolating portions 120. In this case, the material used for the planarization layer 121 may be completely embedded in the isolating portions 120, as shown in FIG. 2E, or the embedded material may have a cavity.

As the material of the planarization layer 121 and the isolating portions 120, a material having a refractive index lower than that of the protection layer 116 is usable. If silicon nitride is used for the protection layer 116, a material having a refractive index of, for example, 1.2 to 1.8 relative to that (2.0) of silicon nitride may be used to form the planarization layer 121 and the isolating portions 120. If acrylic resin is used as the material to form the planarization layer 121 and embedded in the isolating portions 120, the refractive index can be about 1.5.

Figure 3A:
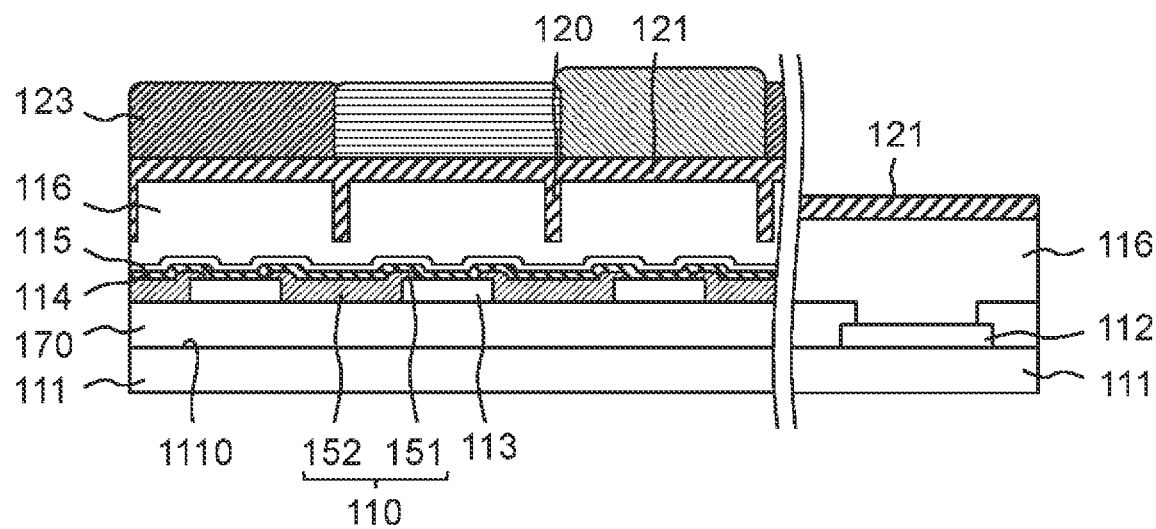
FIGS. 3A to 3D are sectional views for explaining a method of manufacturing the display device shown in FIG. 1.

After the formation of the planarization layer 121, the color filter layers 123 corresponding to the light emitting elements are formed, as shown in FIG. 3A. If the light emitting elements are arranged in an array, the color filter layers 123 can be called a color filter array. The color filter layers 123 can be formed using a photolithography step of, for example, coating the planarization layer 121 with a photosensitive resin using acrylic resin or the like corresponding to the colors and then performing exposure and development.

Figure 3B:
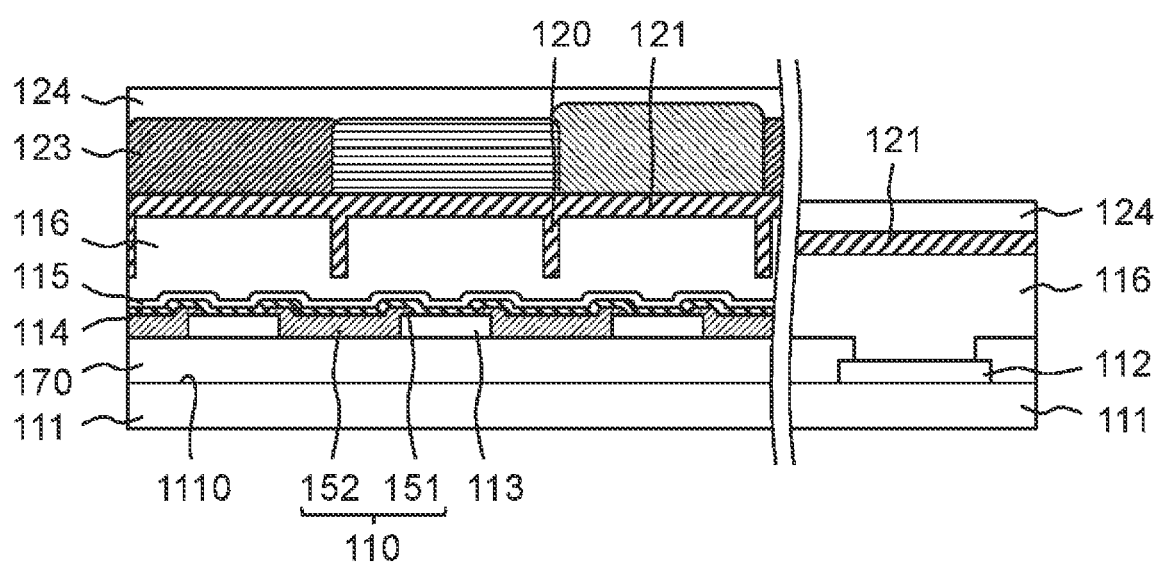

After the formation of the color filter layers 123, the protection film 124 is formed on the color filter layers 123, as shown in FIG. 3B. The protection film 124 can also function as a planarization layer for suppressing the unevenness formed on the upper surfaces of the color filter layers 123. The protection film 124 may be made of an organic material such as acrylic resin, or may be made of an inorganic material such as silicon oxide or silicon oxynitride. In this embodiment, an arrangement in which the protection film 124 is formed in the display device 100 is shown. However, the present invention is not limited to this. An arrangement in which the protection film 124 is not formed, and the color filter layers 123 and the glass plate 127 are bonded via the bonding member 126 to be described later may be employed.

Figure 3C:
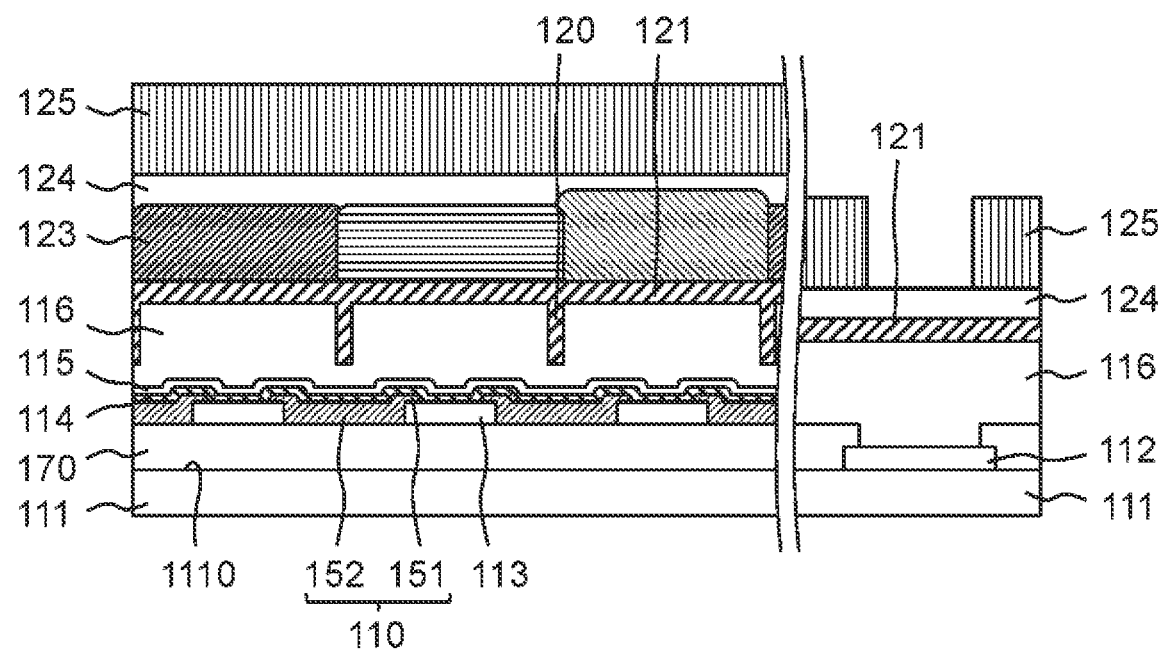

Next, a step of exposing the pad electrode 112 in the peripheral region is performed. First, as shown in FIG. 3C, a resist mask 125 having an opening above the pad electrode 112 is formed on the protection film 124. The resist mask 125 can be formed using a photolithography step of, for example, coating the protection film 124 with a photoresist using novolac resin or the like and then performing exposure and development.

Figure 3D:
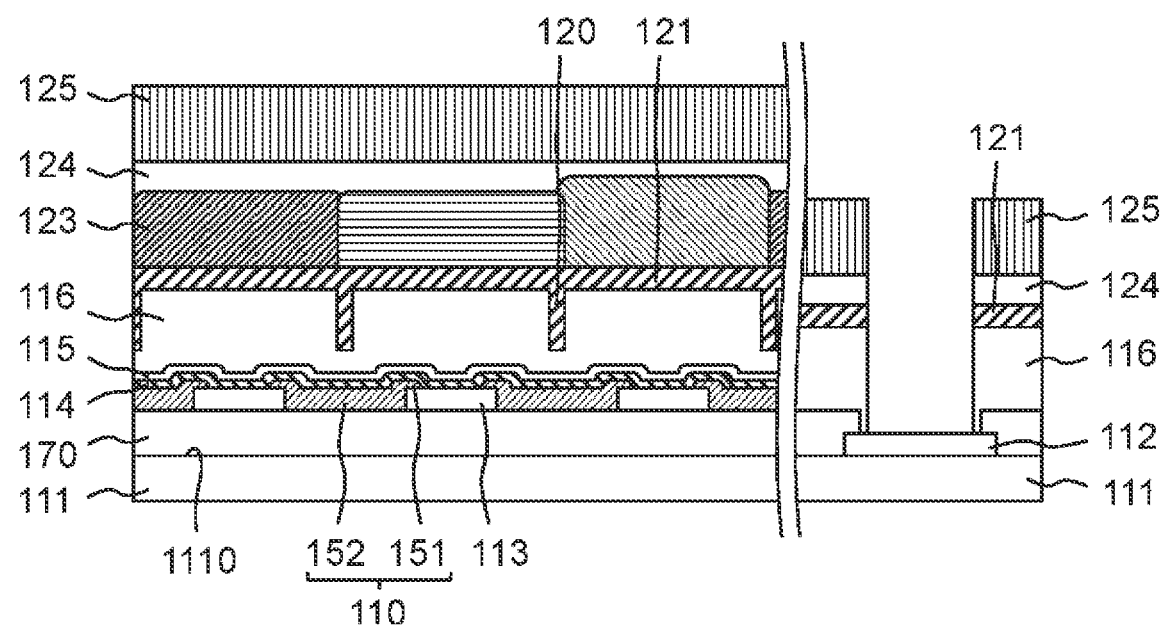

After the formation of the resist mask 125, the protection film 124, the planarization layer 121, and the protection layer 116 are etched using, for example, dry etching, thereby exposing the pad electrode 112. If the protection film 124 and the planarization layer 121 are made of acrylic resin, dry etching is performed using a gas such as oxygen or ozone, and if the protection layer 116 is made of silicon nitride, dry etching is performed using a gas such as $CF_4$ or $SF_6$, thereby exposing the pad electrode 112, as shown in FIG. 3D.

Figure 4A:
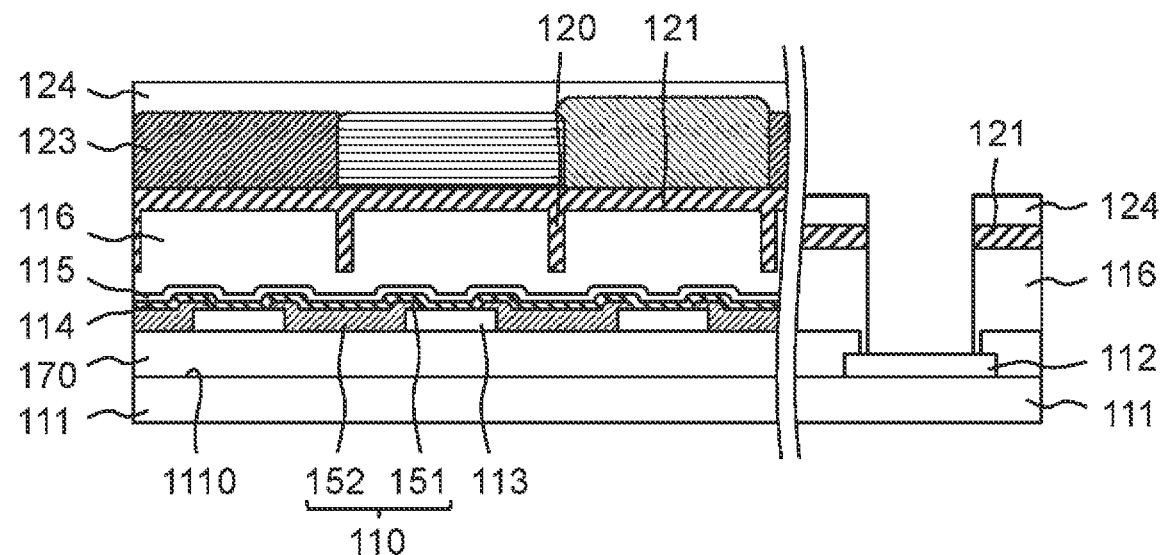
FIGS. 4A to 4D are sectional views for explaining a method of manufacturing the display device shown in FIG. 1.

After the pad electrode 112 is exposed, the resist mask 125 is removed, as shown in FIG. 4A. The resist mask 125 can be removed by a wet process using a resist stripper, or a dry process using oxygen or ozone.

Figure 4B:
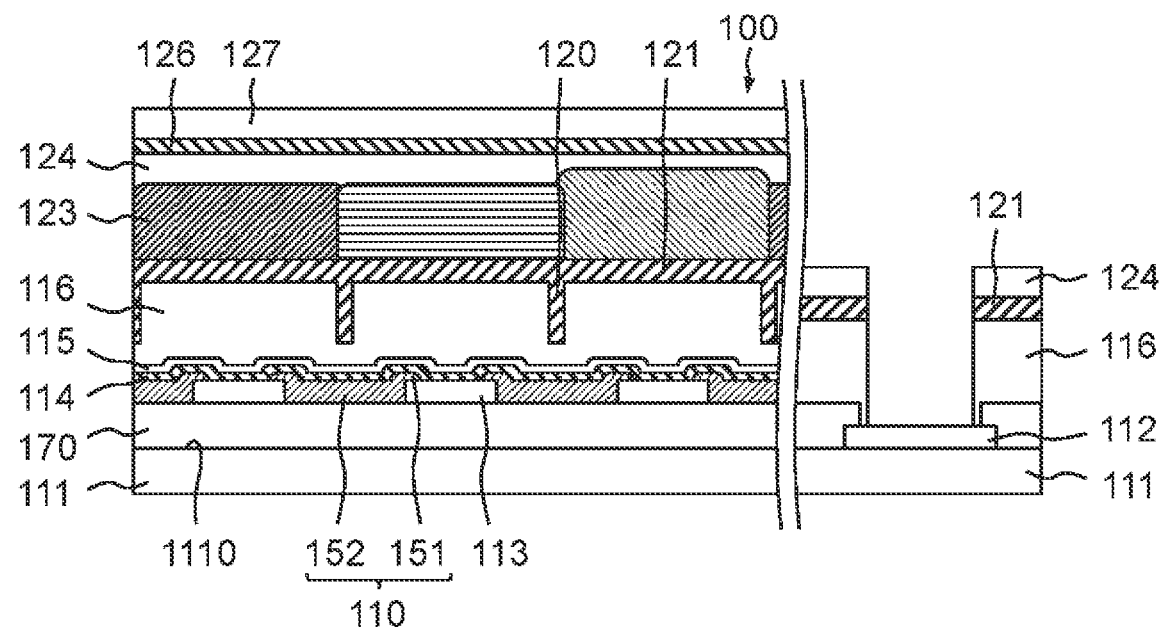

Next, as shown in FIG. 4B, the glass plate 127 is bonded via the bonding member 126 such as an adhesive. The glass plate 127 may use not glass but plastic or the like as the material. Using the above steps, the display device 100 shown in FIG. 1 is formed.

In the display device 100, the protection layer 116 has a thickness of 1 µm or more to protect the organic layer 114 from water or the like. For this reason, in the protection layer 116 under the color filter layers 123, light output from the organic layer 114 diffuses between the adjacent light emitting elements, and light leakage occurs at a high possibility. In this embodiment, the isolating portions 120 are arranged in the protection layer 116 at the portions between the light emitting elements. In addition, the isolating portions 120 are made of a material having a refractive index lower than that of the protection layer 116. With this structure, the diffused light is reflected by the interfaces between the protection layer 116 and the isolating portions 120, and light leakage between the adjacent light emitting elements is suppressed. As a result, the quality of a displayed image can be improved.

Figure 4C:
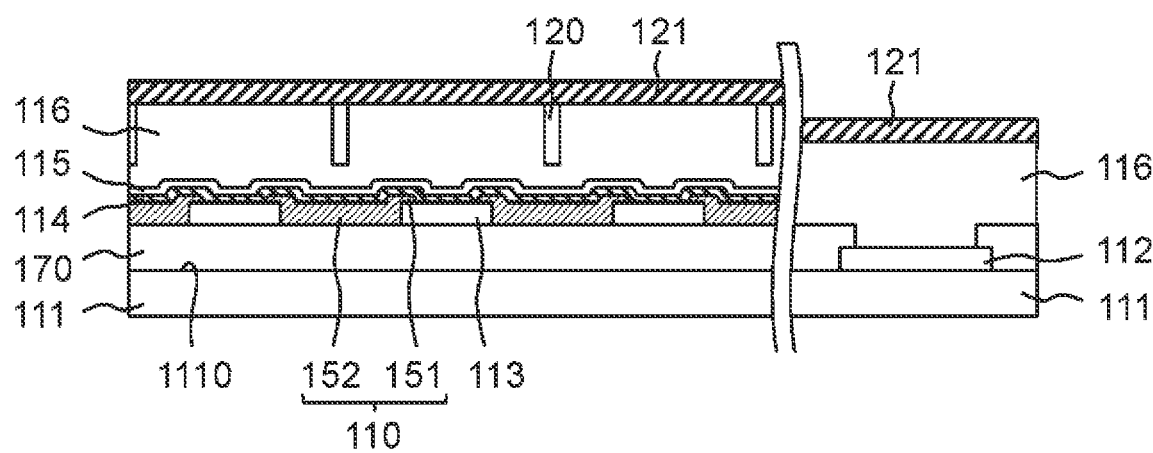
Figure 4D:
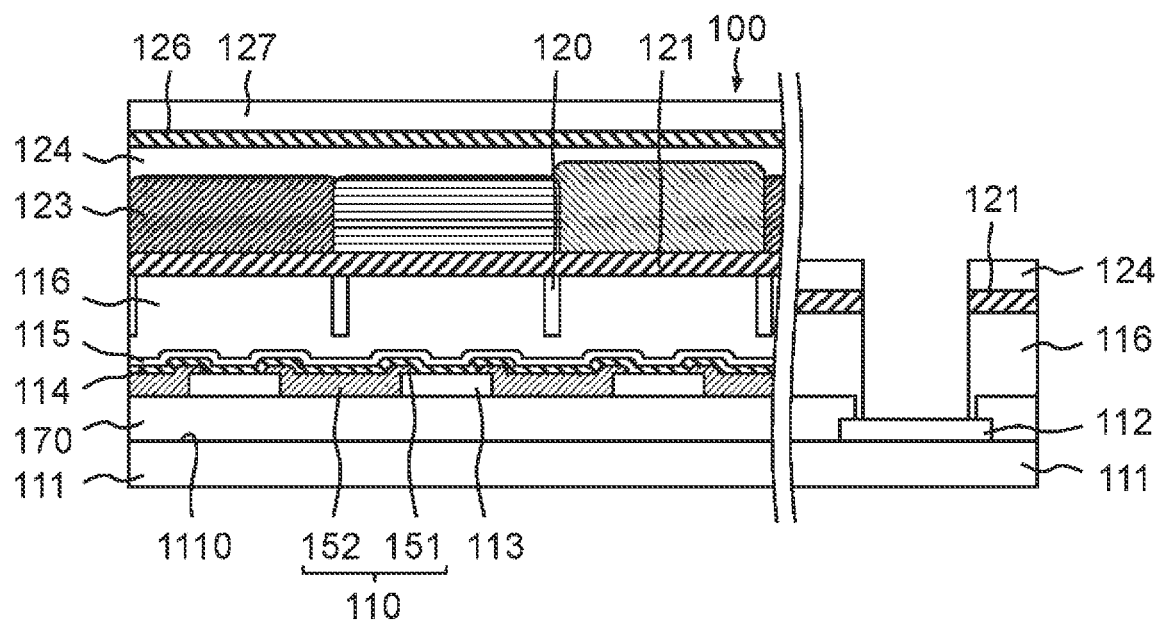

In the display device 100 shown in FIG. 1, the isolating portions 120 are filled with a material having a refractive index lower than that of the protection layer 116. However, the present invention is not limited to this. The isolating portions 120 may be cavities, as shown in FIG. 4D. The manufacturing method in this case will be described.

After the same steps as those shown in FIGS. 2A to 2D described above are performed, the planarization layer 121 configured to suppress the unevenness on the upper surface 1160 of the protection layer 116 is formed. At this time, as shown in FIG. 4C, the planarization layer 121 is formed such that it can function as a lid for the isolating portions 120. More specifically, silicon oxide or silicon oxynitride is formed as the planarization layer 121 using, for example, CVD with a high growth rate, thereby forming a cavity in each isolating portion 120. Alternatively, a cavity can be formed in each isolating portion 120 by, for example, adjusting the viscosity of the resin such as acrylic resin to form the planarization layer 121 or a condition at the time of coating. The cavities may be filled with air, a rare gas such as helium or argon, or an inert gas such as nitrogen, or may be vacuum. Additionally, as shown in FIG. 4D, the isolating portions 120 may be complete cavities, or the material of the planarization layer 121 may enter part of each isolating portion 120.

After the formation of the planarization layer 121, the display device 100 shown in FIG. 4D is formed using the same steps as those from FIG. 3A described above. Even if the isolating portions 120 have cavities, the light diffused in the protection layer 116 is reflected by the interfaces between the protection layer 116 and the isolating portions 120, and light leakage between the adjacent light emitting elements is suppressed.

Figure 5:
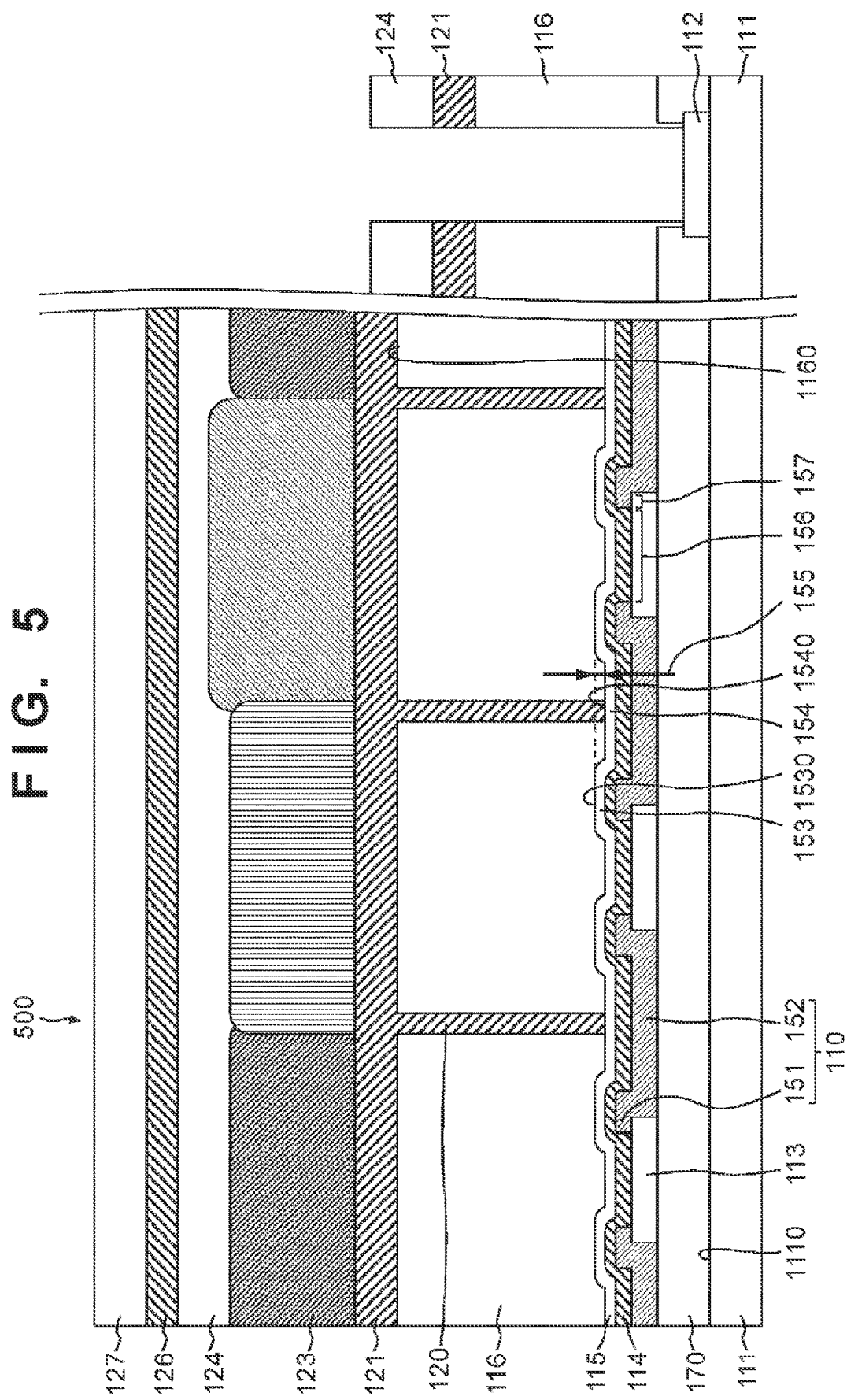
FIG. 5 is a sectional view for explaining a modification of the display device shown in FIG. 1.
Figure 6A:
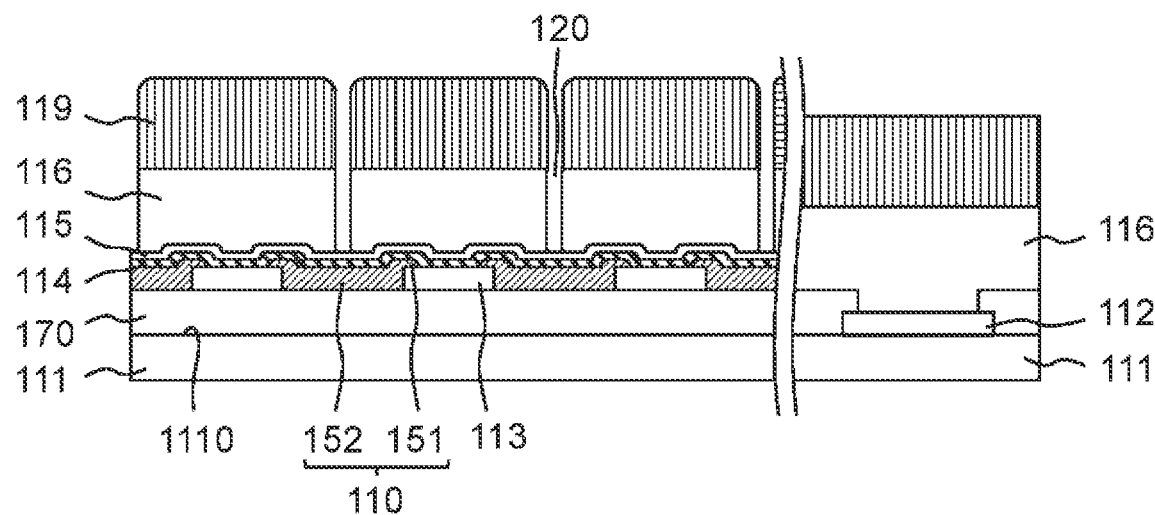
FIGS. 6A and 6B are sectional views for explaining a method of manufacturing the display device shown in FIG. 5.
Figure 6B:
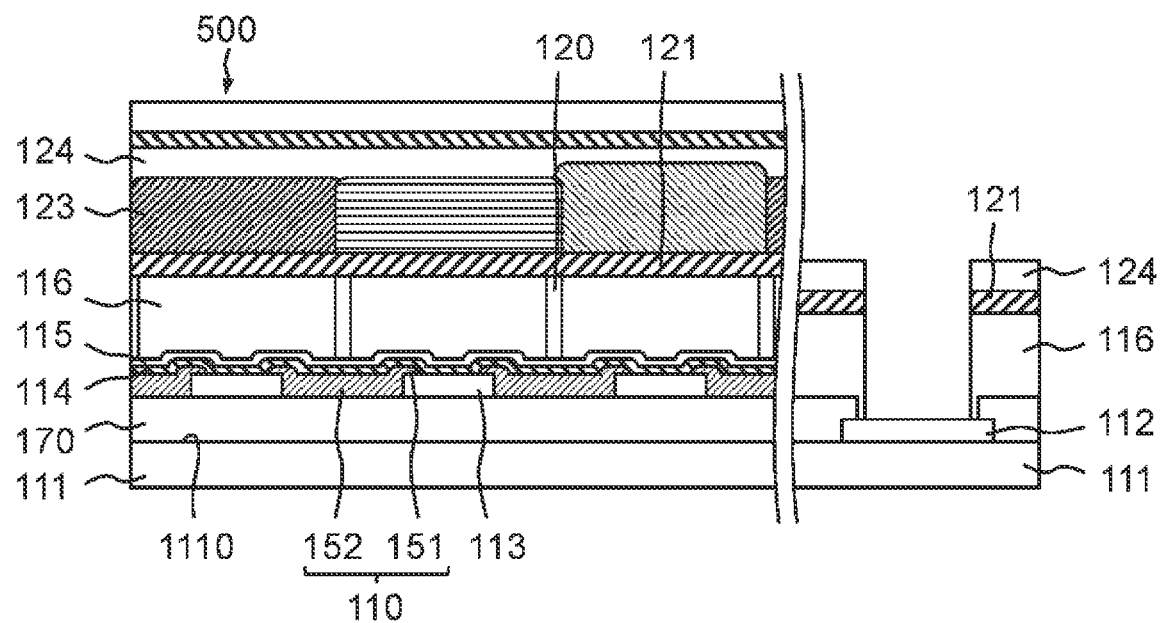

The arrangement of a display device and a method of manufacturing the display device according to another embodiment of the present invention will be described with reference to FIGS. 5, 6A, and 6B. FIG. 5 is a sectional view showing the arrangement of a display device 500 according to a second embodiment of the present invention. This embodiment is different from the above-described first embodiment in that the bottom surface of each isolating portion 120 provided in a protection layer 116 is in contact with the upper surface of an upper electrode 115, as shown in FIG. 5. The rest may be the same as in the above-described first embodiment. For this reason, the arrangement from a substrate 111 to the upper electrode 115 of the display device 500 can be the same as in the display device 100 according to the first embodiment shown in FIG. 1.

A method of manufacturing the display device 500 according to this embodiment will be described next. First, the same steps as those shown in FIGS. 2A and 2B described above are performed, thereby forming, on the protection layer 116, a resist mask 119 having openings in portions arranged above portions 152 of an insulator portion 110. After the formation of the resist mask 119, an etching step of etching the protection layer 116 via the opening portions of the resist mask 119 using, for example, dry etching to form trenches that form the isolating portions 120 is performed. In the above-described first embodiment, etching is performed such that the bottom surfaces of the isolating portions 120 are within the height at which the protection layer 116 exists with respect to the surface 1110 of the substrate 111. On the other hand, in this embodiment, as shown in FIG. 6A, the etching is performed until the bottom surfaces of the trenches that form the isolating portions 120 come into contact with upper surfaces 1540 of portions 154 of the upper electrode 115 arranged under the isolating portions 120. In this case, the trenches that form the isolating portions 120 may be formed using the upper electrode 115 as an etching stopper.

In this embodiment as well, since the isolating portions 120 can be entry routes of water to an organic layer 114, the side and bottom surfaces of the isolating portions 120 are not in contact with the organic layer 114. When the upper electrode 115 is arranged between the isolating portions 120 and the organic layer 114, the organic layer 114 is sealed and protected from water or the like.

After the formation of the isolating portions 120 to the protection layer 116, the display device 500 is formed using the same steps as those from FIG. 2E described above. In the display device 500, a material having a refractive index lower than that of the protection layer 116 may be embedded in the isolating portions 120, as shown in FIG. 5, or the isolating portions 120 may be cavities, as shown in FIG. 6B.

In this embodiment as well, light diffused in the protection layer 116 is reflected by the interfaces between the protection layer 116 and the isolating portions 120, and light leakage between adjacent light emitting elements is suppressed. Since the isolating portions 120 are arranged at positions close to the organic layer 114, as compared to the above-described first embodiment, light leakage can further be suppressed.

Figure 7:
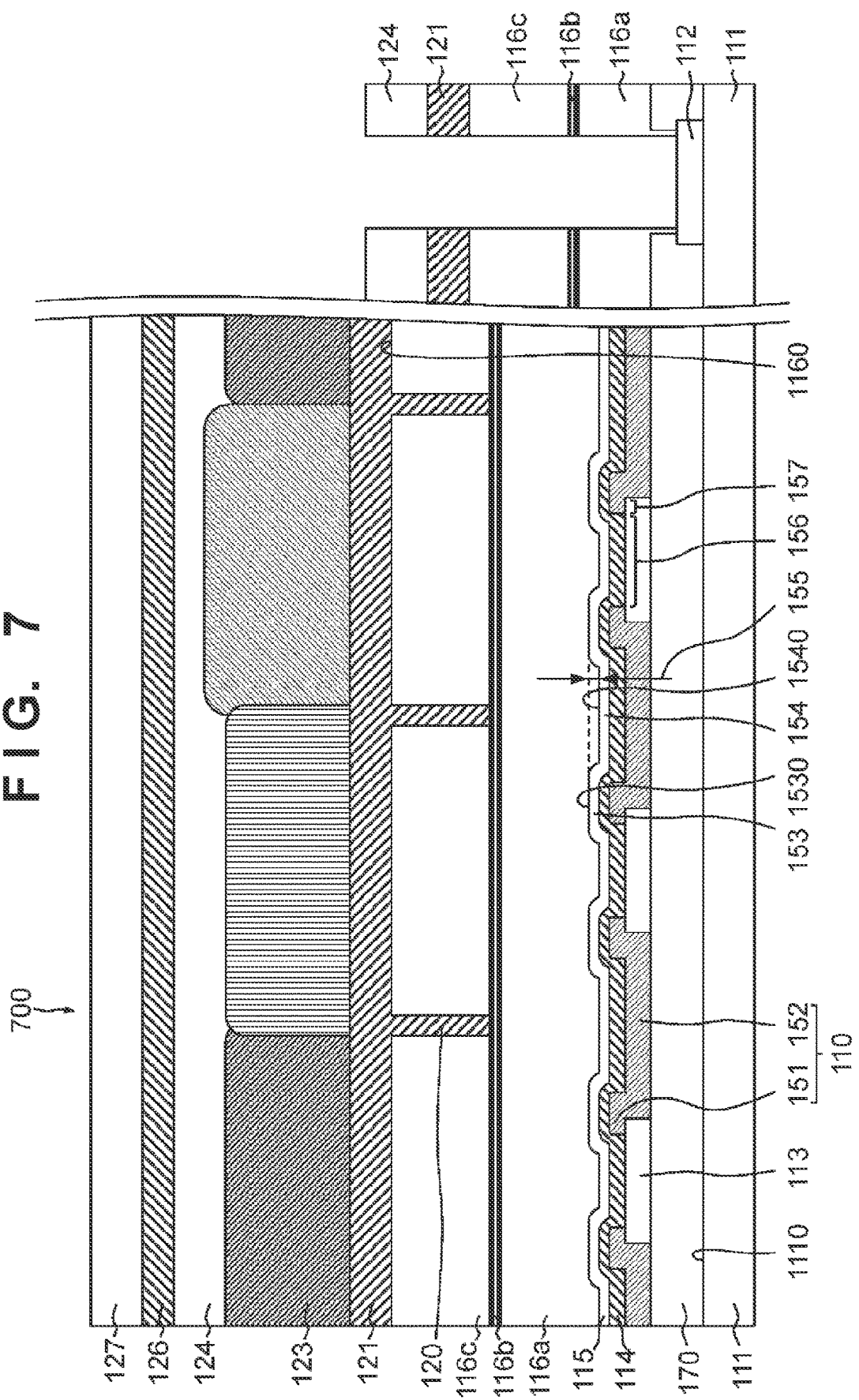
FIG. 7 is a sectional view for explaining another modification of the display device shown in FIG. 1.
Figure 8A:
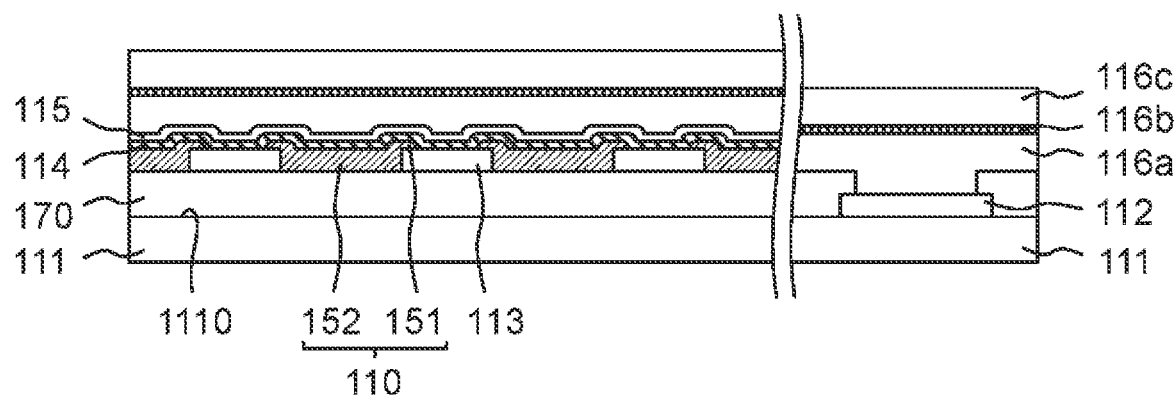
FIGS. 8A to 8D are sectional views for explaining a method of manufacturing the display device shown in FIG. 7.

The arrangement of a display device and a method of manufacturing the display device according to still another embodiment of the present invention will be described with reference to FIGS. 7 to 8D. FIG. 7 is a sectional view showing the arrangement of a display device 700 according to a third embodiment of the present invention. This embodiment is different from the above-described first embodiment in that a protection layer 116 has a stacked structure including protection layers 116a to 116c, as shown in FIG. 7. The rest may be the same as in the above-described first embodiment. For this reason, the arrangement from a substrate 111 to an upper electrode 115 of the display device 700 can be the same as in the display device 100 according to the first embodiment shown in FIG. 1.

A method of manufacturing the display device 700 will be described next. Of the steps shown in FIG. 2A described above, the same steps may be performed up to the step of forming the upper electrode 115. Next, the protection layer 116 is formed to cover the upper surface of the upper electrode 115 and the peripheral region.

In this embodiment, the protection layer 116 has a stacked structure including three protection layers 116a to 116c. First, the protection layer 116a is formed on the upper electrode 115. The protection layer 116a uses, for example, silicon nitride and has a thickness of, for example, 0.5 μm or more. Next, the protection layer 116b using a material different from that of the protection layer 116a is formed on the protection layer 116a. The protection layer 116b uses, for example, aluminum oxide. Then, the protection layer 116c using a material different from that of the protection layer 116b is formed on the protection layer 116b. The protection layer 116c may be formed using the same material as that of the protection layer 116a. The protection layer 116c uses, for example, silicon nitride and has a thickness of, for example, 0.5 μm or more. FIG. 8A is a sectional view after the formation of the protection layer 116c. The thickness of the protection layers 116a and 116c is not limited to that described above. For example, the thicknesses of the protection layers 116a and 116c each using silicon nitride may be 0.8 μm and 0.2 μm, respectively. The thickness of each of the protection layers 116a to 116c can appropriately be set within a range capable of protecting an organic layer 114 from water or the like. When the protection layer 116 has a three-layer structure, as described above, the coverage can be improved as compared to a case in which the protection layer 116 includes one layer, and water that enters the organic layer 114 and the upper electrode 115 can be suppressed.

Figure 8B:
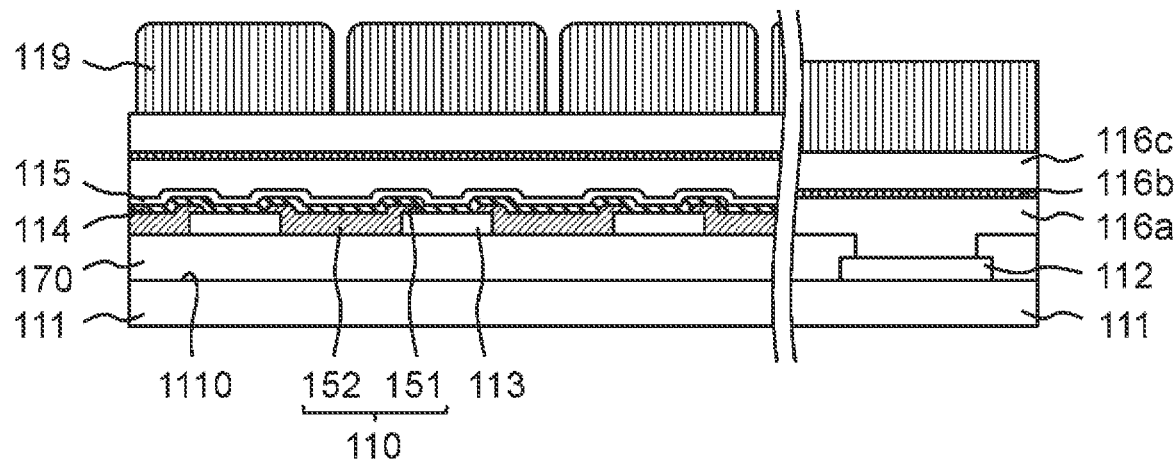
Figure 8C:
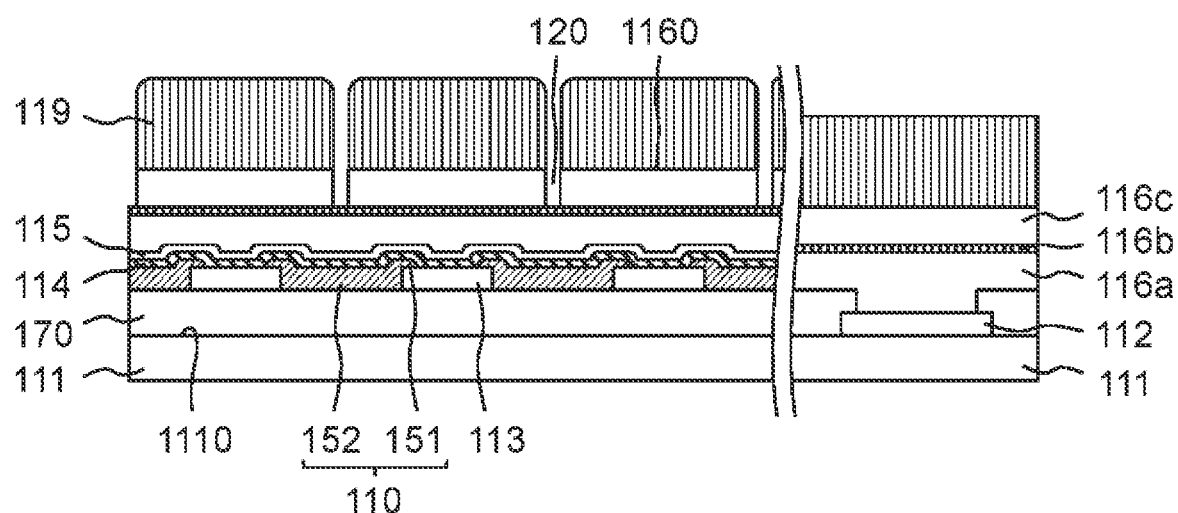
Figure 8D:
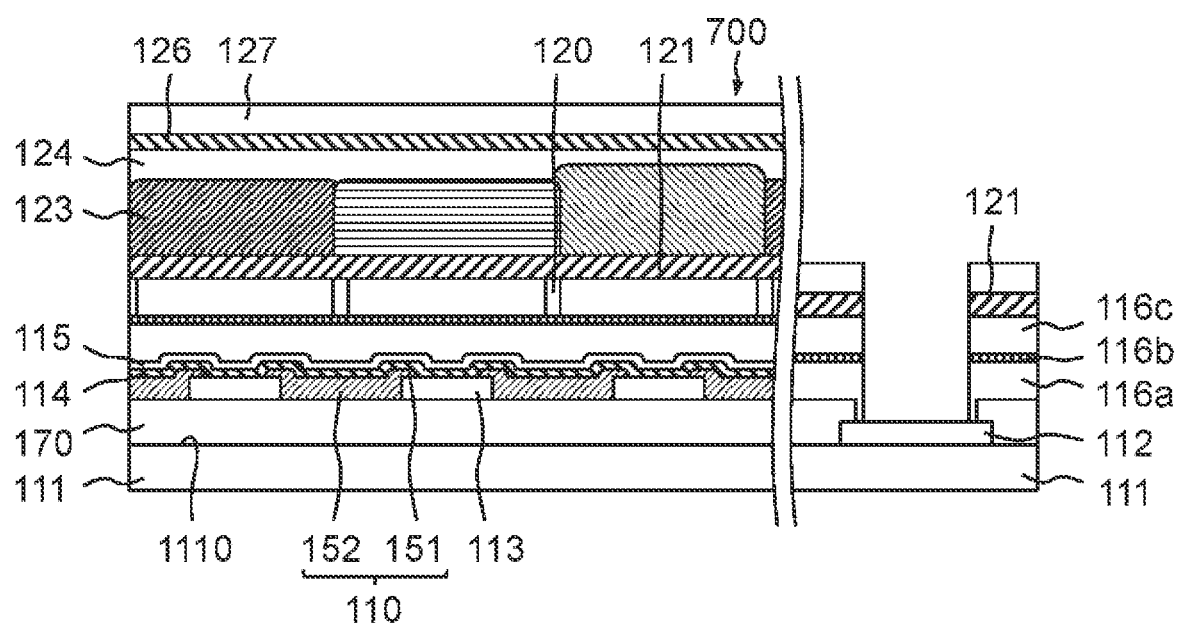

After the protection layers 116a to 116c having the stacked structure are formed, a resist mask 119 having openings in portions arranged above portions 152 of an insulator portion 110 is formed on the protection layer 116c, as shown in FIG. 8B. Next, an etching step of etching the protection layer 116 via the opening portions of the resist mask 119 using, for example, dry etching to form trenches that form isolating portions 120 and extend from an upper surface 1160 of the protection layer 116c toward the substrate 111 is performed. At this time, the isolating portions 120 may be formed only in the protection layer 116c of the protection layers 116a to 116c using the protection layer 116b as an etching stopper.

In this embodiment as well, since the isolating portions 120 can be entry routes of water to the organic layer 114, the side and bottom surfaces of the isolating portions 120 are not in contact with the organic layer 114. In this embodiment, when the protection layers 116a and 116b are arranged between the isolating portions 120 and light emitting elements, the light emitting elements are sealed and protected from water or the like.

After the formation of the trenches that form the isolating portions 120 to the protection layer 116c, the display device 700 is formed using the same steps as those from FIG. 2E described. In the display device 700, a material having a refractive index lower than that of the protection layer 116 may be embedded in the isolating portions 120, as shown in FIG. 7, or the isolating portions 120 may be cavities, as shown in FIG. 8D.

In this embodiment as well, light diffused in the protection layers 116a to 116c is reflected by the interfaces between the protection layer 116c and the isolating portions 120, and light leakage between adjacent light emitting elements is suppressed.

Figure 10A:
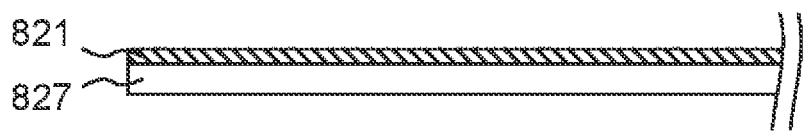
FIGS. 10A to 10D are sectional views for explaining a method of manufacturing the display device shown in FIG. 9.

The arrangement of a display device and a method of manufacturing the display device according to still another embodiment of the present invention will be described with reference to FIGS. 9 to 10D. FIG. 9 is a sectional view showing the arrangement of a display device 900 according to a fourth embodiment of the present invention. This embodiment is different from the above-described first embodiment in the arrangement on the upper side (the side of the protection layer 116 opposite to a substrate 111) of an upper surface 1160 of a protection layer 116, as shown in FIG. 9. The rest may be the same as in the above-described first embodiment. For this reason, the arrangement from the substrate 111 to an upper electrode 115 of the display device 900 can be the same as in the display device 100 according to the first embodiment shown in FIG. 1.

A method of manufacturing the display device 900 will be described next. First, the same steps as those shown in FIGS. 2A to 2D described above are performed, thereby forming the substrate 111 including the protection layer 116 provided with trenches that form isolating portions 120. After the formation of the trenches that form the isolating portions 120, a pad electrode 112 is exposed without performing the steps shown in FIGS. 2E, 3A, and 3B. If the trenches that form the isolating portions 120 have openings up to the interface between the protection layer 116 and the upper electrode 115, as in the above-described second embodiment, etching for exposing the pad electrode 112 may be performed at the same time as the formation of the trenches that form the isolating portions 120.

In the above-described embodiments, color filters are directly formed on a planarization layer 121 arranged on the protection layer 116. In this embodiment, however, color filter layers 823 formed on a color filter substrate 827 and the substrate 111 including the protection layer 116 provided with the isolating portions 120 are bonded, thereby forming the display device 900. To do this, first, as shown in FIG. 10A, a planarization layer 821 is formed on the color filter substrate 827. A material such as glass or plastic is usable for the color filter substrate 827. The planarization layer 821 may be formed by, for example, coating the color filter substrate 827 with an organic material such as acrylic resin and curing the resin.

Figure 10B:
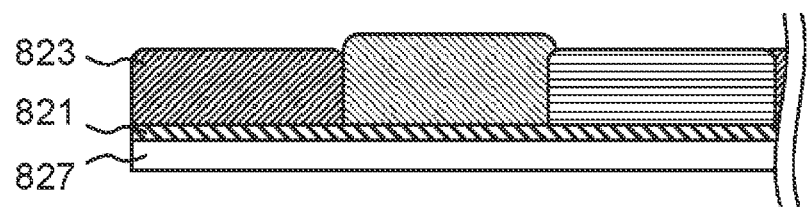

After the formation of the planarization layer 821, the color filter layers 823 corresponding to light emitting elements are formed, as shown in FIG. 10B. In a display device in which the light emitting elements are arranged in an array, the color filter layers 823 formed on the color filter substrate 827 to be bonded can be called a color filter array. The color filter layers 823 can be formed using a photolithography step of, for example, coating the planarization layer 821 with a photosensitive resin using acrylic resin or the like corresponding to the colors and then performing exposure and development.

Figure 10C:
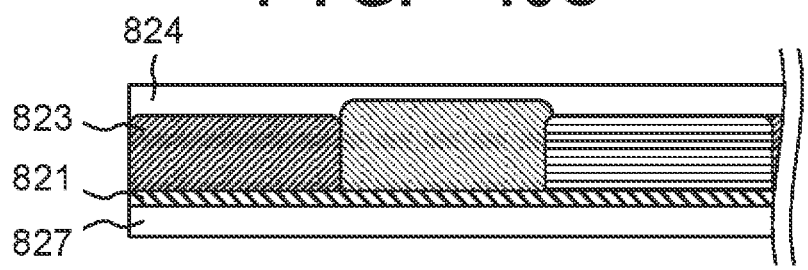
Figure 10D:
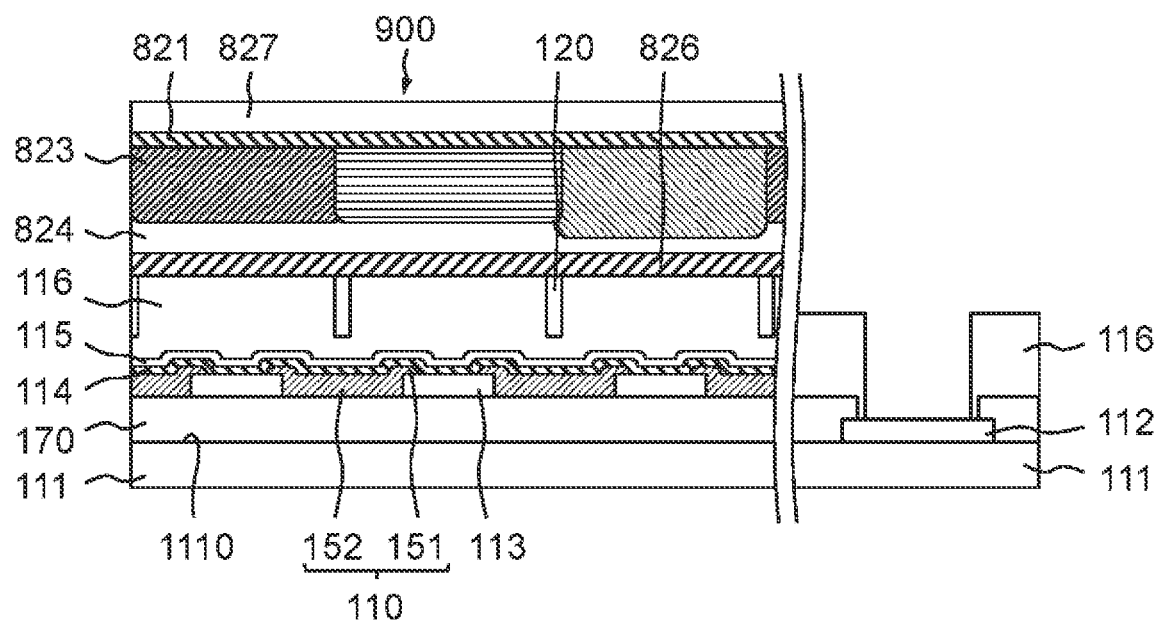

After the formation of the color filter layers 823, a protection layer 824 is formed on the color filter layers 823, as shown in FIG. 10C. The protection film 824 can also function as a planarization layer for suppressing the unevenness formed on the upper surfaces of the color filter layers 823. The protection film 824 may be made of an organic material such as acrylic resin, or may be made of an inorganic material such as silicon oxide or silicon oxynitride. In this embodiment, an arrangement in which the protection film 824 is formed is shown. However, the present invention is not limited to this. An arrangement in which the protection film 824 is not formed, and the color filter layers 823 and the substrate 111 including the protection layer 116 provided with the isolating portions 120 are bonded via a bonding member 826 to be described later may be employed.

Next, the substrate 111 formed by performing the same steps as the steps in FIGS. 2A to 2D described above and the step of exposing the pad electrode 112 and the color filter substrate 827 formed by performing the steps shown in FIGS. 10A to 10C are bonded. At this time, the substrates are bonded via the bonding member 826 such that the protection layer 116 and the protection layer 824 face each other. At this time, for the bonding member 826 used for bonding, a material capable of being embedded in the trenches that form the isolating portions 120 formed in the protection layer 116 and having a refractive index lower than that of the protection layer 116 may be used. For example, a resin material having a refractive index of not less than 1.2 and not more than 1.8 may be used for the bonding member 826. The display device 900 shown in FIG. 9 is formed using the material as described above, thereby forming. Instead of filling the isolating portions 120 with the bonding member 826, the isolating portions 120 may cavities, as shown in FIG. 10D. In this case, the isolating portions 120 can be filled with the bonding member 826 or formed as cavities by appropriately selecting the material used for the bonding member 826.

In this embodiment, the substrate 111 formed by performing the steps shown in FIGS. 2A to 2D described above and the color filter substrate 827 formed by performing the steps shown in FIGS. 10A to 10C are bonded. However, the present invention is not limited to this. For example, the substrate 111 on which the structure up to the planarization layer 121 shown in FIGS. 2A to 2E described above is formed and the color filter substrate 827 formed by performing the steps shown in FIGS. 10A to 10C may be bonded via the bonding member 826.

In this embodiment as well, since the isolating portions 120 can be entry routes of water to the organic layer 114, the side and bottom surfaces of the isolating portions 120 are not in contact with the organic layer 114. When the protection layer 116 is arranged between the isolating portions 120 and the organic layer 114, the light emitting elements are sealed and protected from water or the like. In this embodiment as well, light diffused in the protection layer 116 is reflected by the interfaces between the protection layer 116 and the isolating portions 120, and light leakage between adjacent light emitting elements is suppressed.

Figure 11:
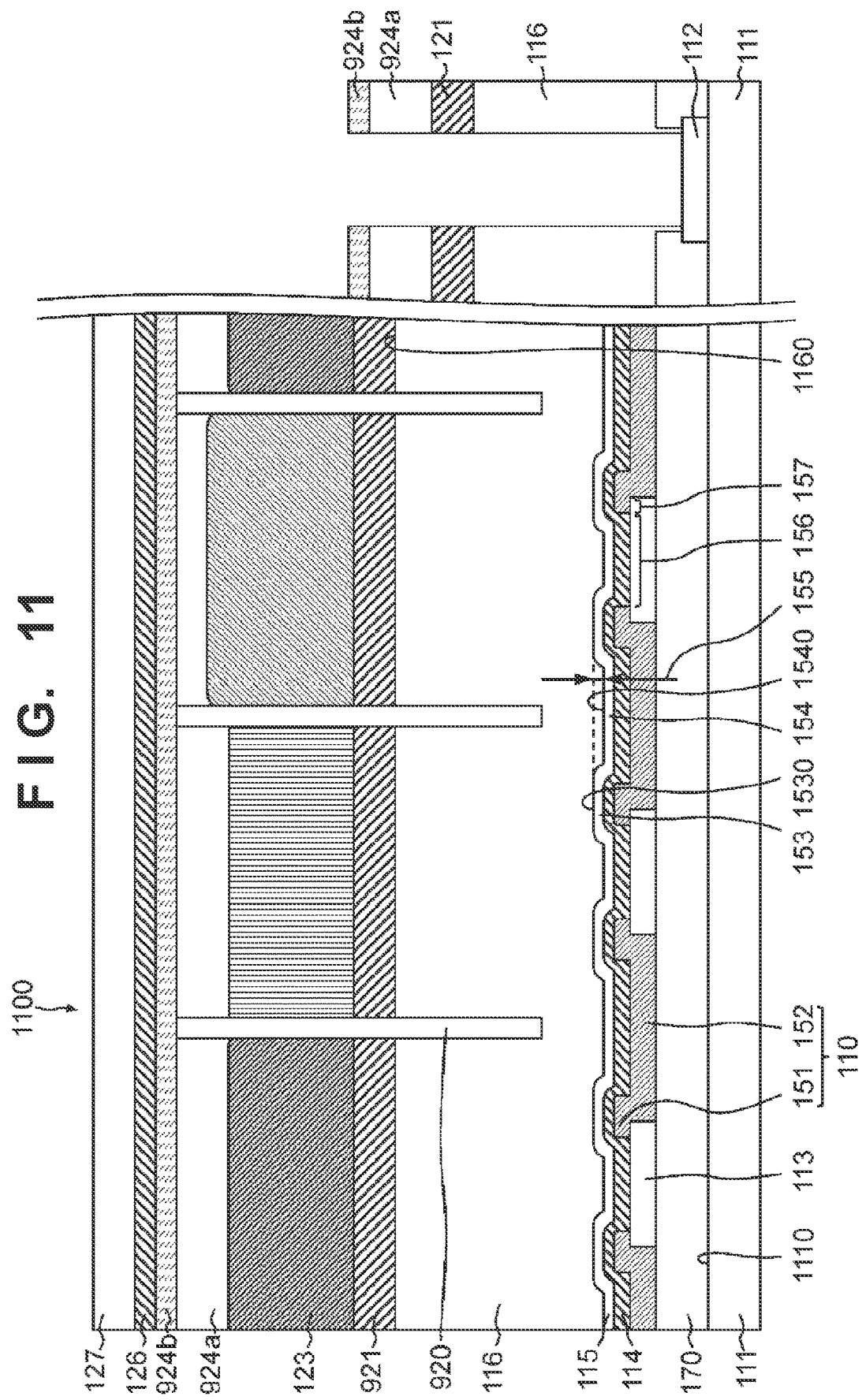
FIG. 11 is a sectional view for explaining still another modification of the display device shown in FIG. 1.

The arrangement of a display device and a method of manufacturing the display device according to still another embodiment of the present invention will be described with reference to FIGS. 11 to 14B. FIG. 11 is a sectional view showing the arrangement of a display device 1100 according to a fifth embodiment of the present invention. In this embodiment, portions of color filter layers 123 arranged above portions 152 of an insulator portion 110 are provided with isolating portions 920, as compared to the above-described first embodiment. Additionally, the isolating portions 920 are formed continuously from a protection layer 116 to the color filter layers 123. The rest may be the same as in the above-described first embodiment. For this reason, the arrangement from a substrate 111 to an upper electrode 115 of the display device 1100 can be the same as in the display device 100 according to the first embodiment shown in FIG. 1.

Figure 12A:
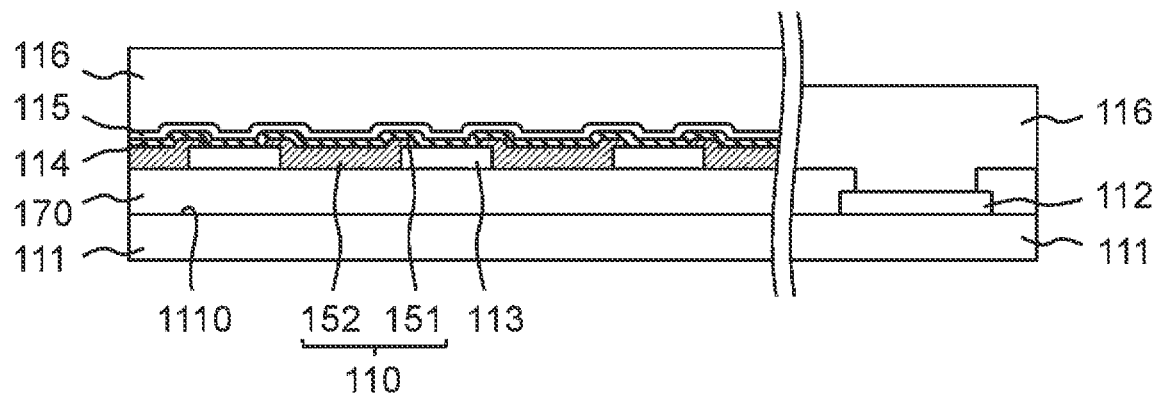
FIGS. 12A to 12C are sectional views for explaining a method of manufacturing the display device shown in FIG. 11.
Figure 12B:
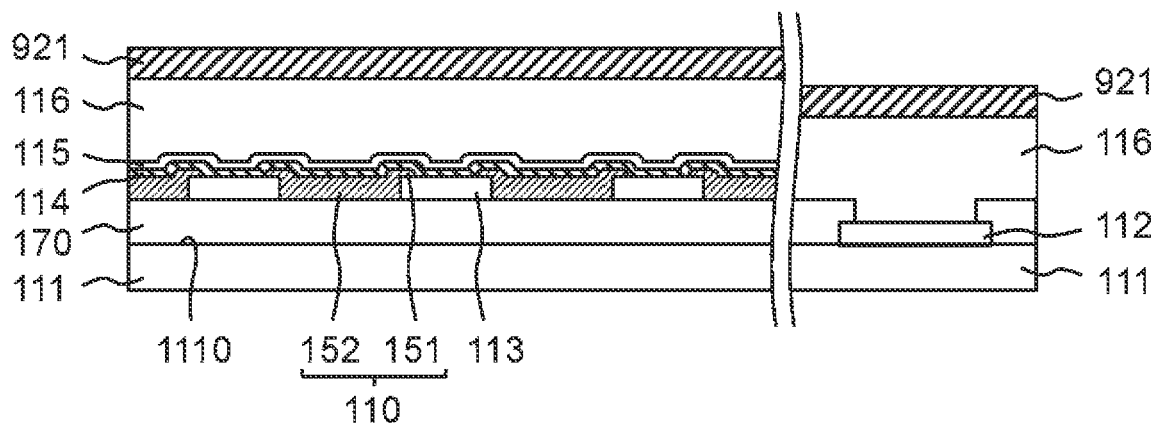

A method of manufacturing the display device 1100 will be described next. First, as shown in FIG. 12A, the protection layer 116 is formed on the substrate 111 using the same steps as those shown in FIG. 2A described above. Next, a planarization layer 921 is formed on the protection layer 116, as shown in FIG. 12B. The planarization layer 921 can be formed by, for example, coating the protection layer 116 with an organic material such as acrylic resin using a spin coater or the like and curing the resin.

Figure 12C:
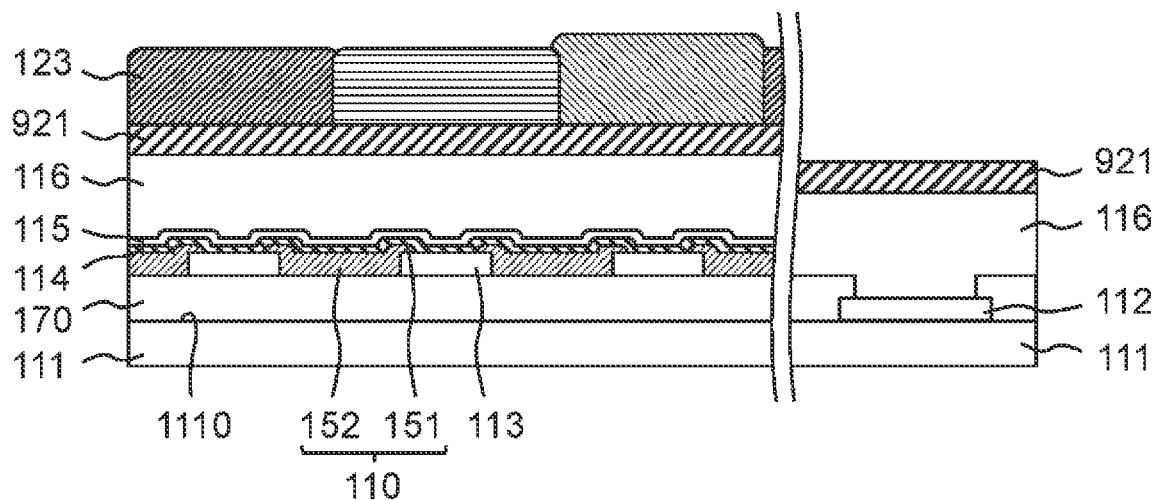

After the formation of the planarization layer 921, the color filter layers 123 corresponding to light emitting elements are formed, as shown in FIG. 12C. If the light emitting elements are arranged in an array, the color filter layers 123 can be called a color filter array. The color filter layers 123 can be formed using a photolithography step of, for example, coating the planarization layer 921 with a photosensitive resin using acrylic resin or the like corresponding to the colors and then performing exposure and development.

Figure 13A:
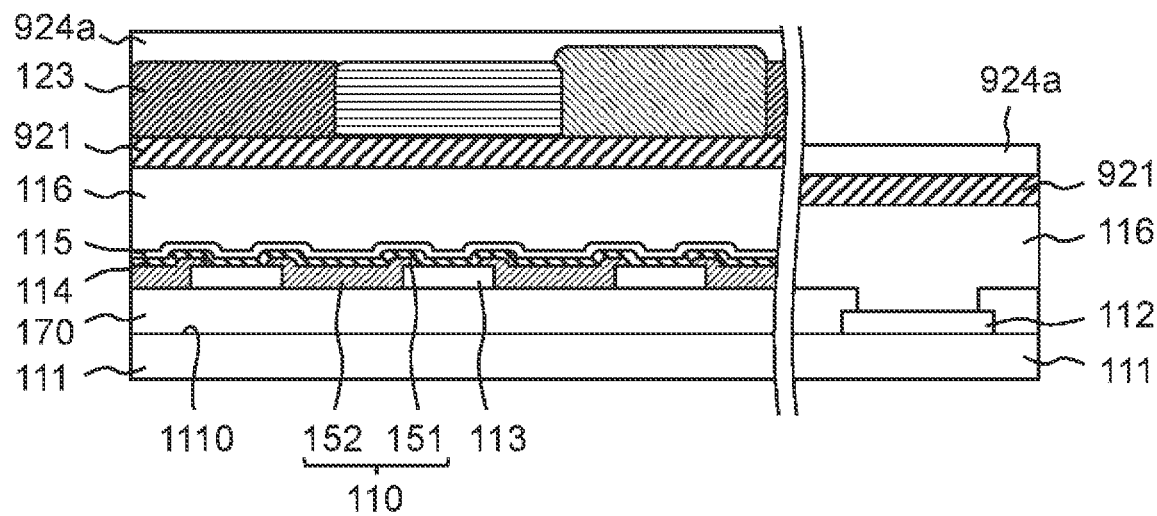
FIGS. 13A to 13C are sectional views for explaining a method of manufacturing the display device shown in FIG. 11.

After the formation of the color filter layers 123, a protection film 924a is formed on the color filter layers 123, as shown in FIG. 13A. The protection film 924a can also function as a planarization layer for suppressing the unevenness formed on the upper surfaces of the color filter layers 123. The protection film 924a may be made of an organic material such as acrylic resin, or may be made of an inorganic material such as silicon oxide or silicon oxynitride.

Figure 13B:
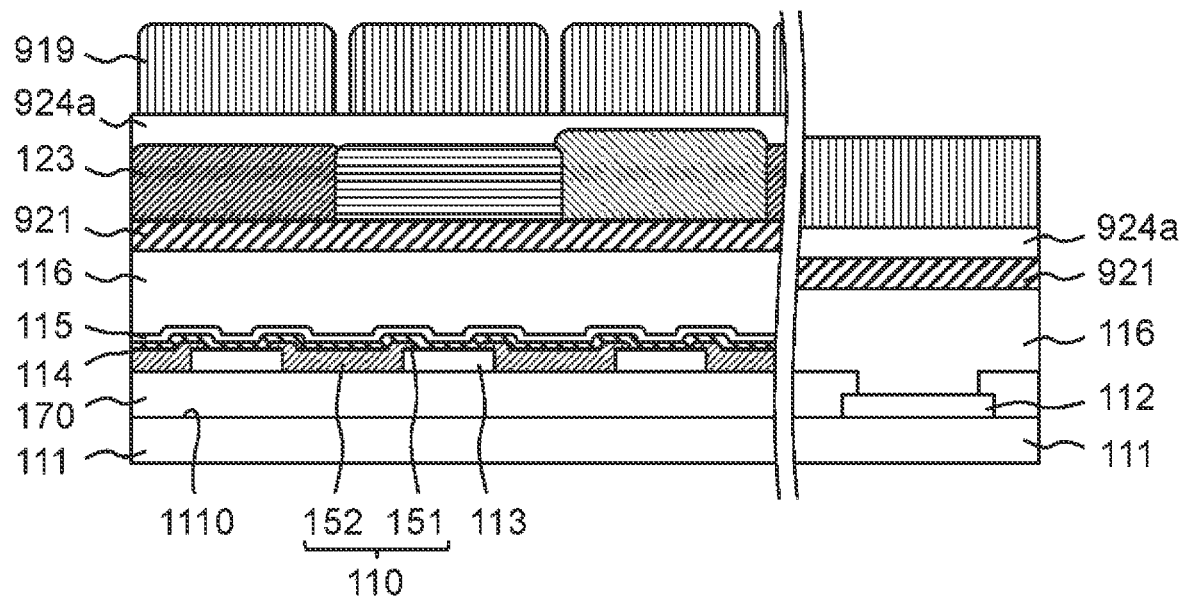

Next, a resist mask 919 is formed on the protection film 924a, as shown in FIG. 13B. The resist mask 919 can be formed using a photolithography step of, for example, coating the protection film 924a with a photoresist using novolac resin or the like and then performing exposure and development. As shown in FIG. 13B, the resist mask 919 has openings in portions arranged above the portions 152 of the insulator portion 110.

Figure 13C:
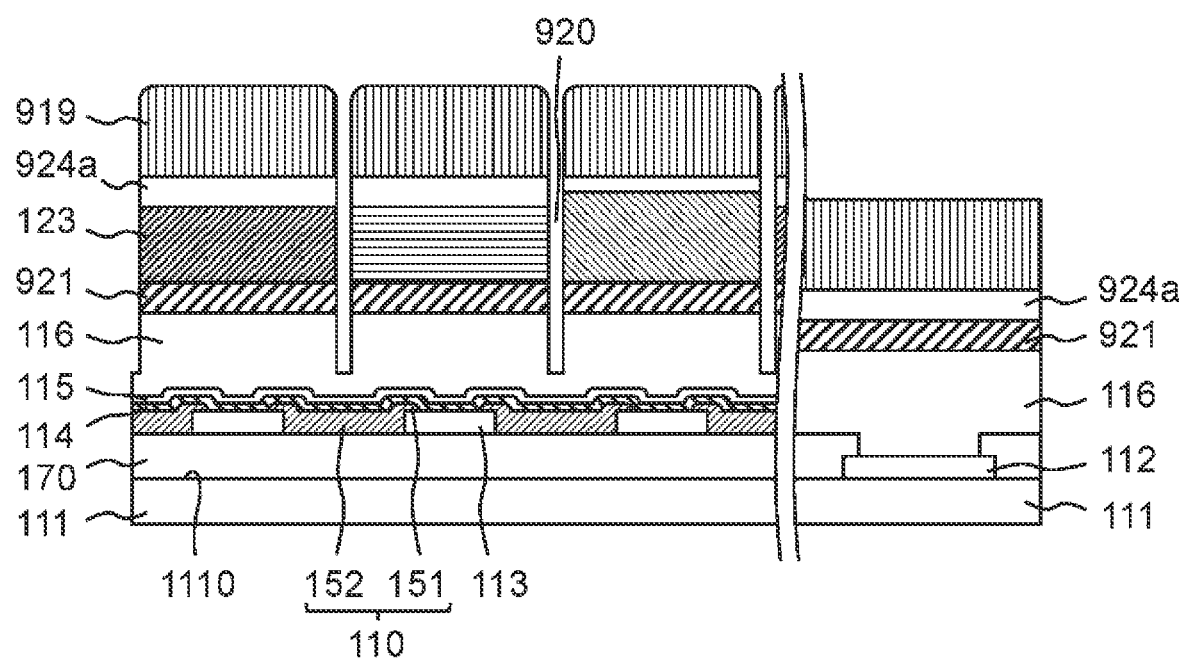

Next, as shown in FIG. 13C, trenches extending through the protection film 924a, the color filter layers 123, and the planarization layer 921 and extending up to the protection layer 116 are formed via the opening portions of the resist mask 119. The trenches that form the isolating portions 920 are formed using, for example, dry etching. The protection layer 116 made of silicon nitride or the like can be dry-etched using a gas such as $CF_4$ or $SF_6$. The planarization layer 921 or the color filter layers 123 made of an organic material can be dry-etched using a gas such as oxygen, ozone, or CO.

Since the isolating portions 920 can be entry routes of water to an organic layer 114, the side and bottom surfaces of the isolating portions 920 are not in contact with the organic layer 114 in this embodiment as well. In addition, the side and bottom surfaces of the isolating portions 920 need not always be in contact with the upper electrode 115. As shown in FIG. 13C, with respect to a surface 1110 of the substrate 111, the bottom surfaces of the isolating portions 920 may be within the height at which the protection layer 116 exists. When the isolating portions 920 are not in contact with the organic layer 114, and the protection layer 116 and the upper electrode 115 are arranged between the isolating portions 920 and the organic layer 114, the organic layer 114 is sealed and protected from water or the like.

Figure 14A:
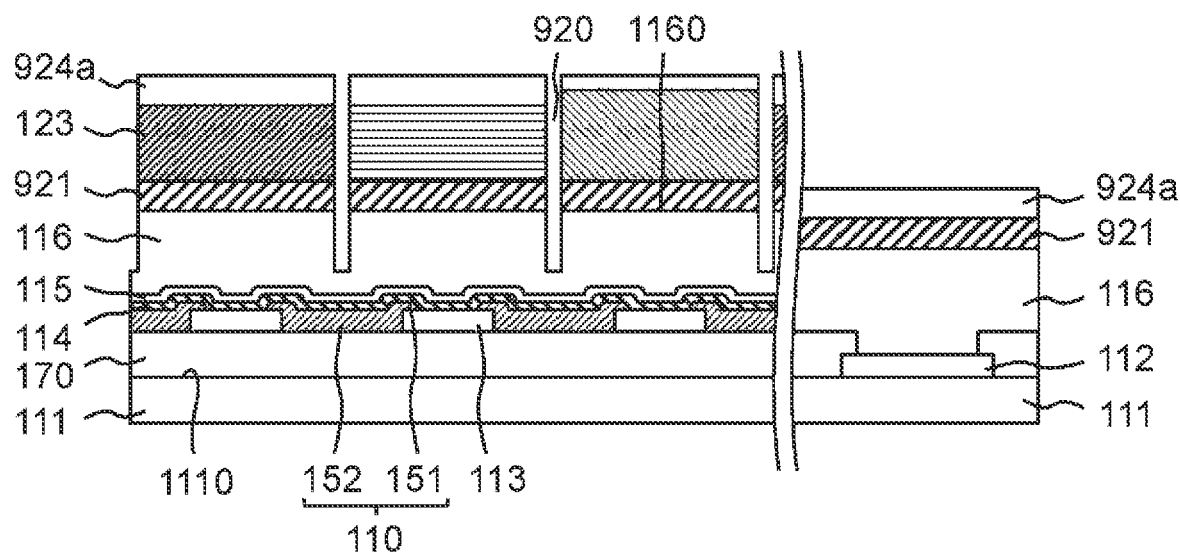
FIGS. 14A and 14B are sectional views for explaining a method of manufacturing the display device shown in FIG. 11.

After the etching step of forming the trenches that form the isolating portions 920, the resist mask 919 is removed. The resist mask 919 can be removed by a wet process using a resist stripper, or a dry process using oxygen or ozone. When the resist mask 919 is removed, the trenches that form the isolating portions 920 extending from an upper surface 1160 of the protection layer 116 toward the substrate 111 are formed in the protection layer 116 above the portions 152 of the insulator portion 110, as shown in FIG. 14A. The color filter layers 123 are not arranged on the isolating portions 920 provided in the protection layer 116, and the isolating portions 920 are formed continuously from the protection layer 116 to the color filter layers 123.

Figure 14B:
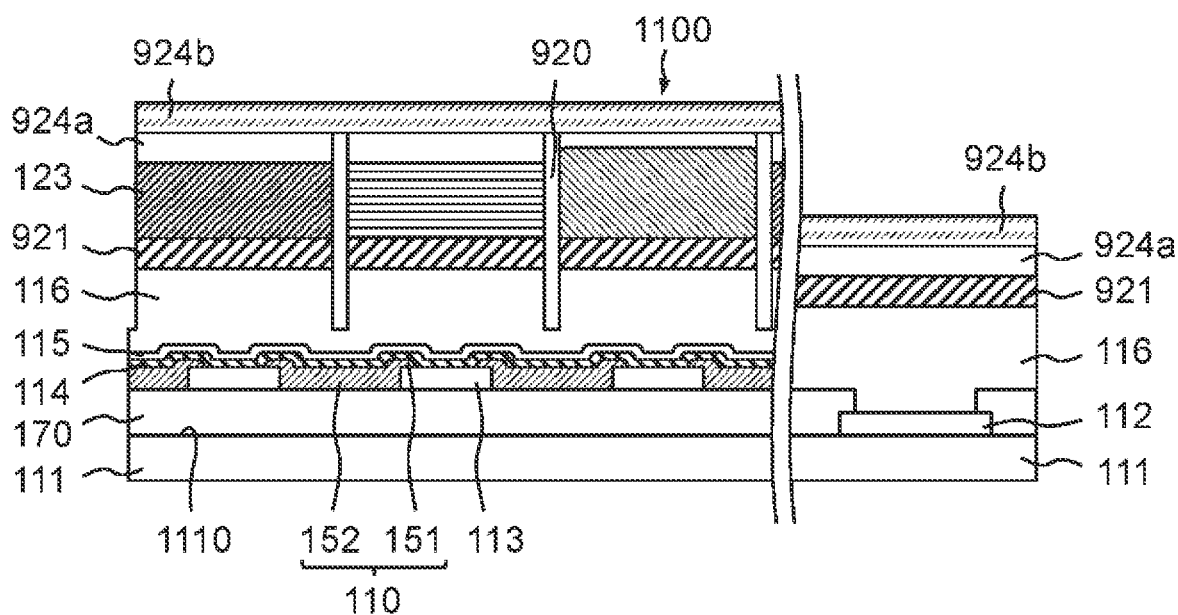

Next, a protection film 924b is formed on the protection film 924a, as shown in FIG. 14B. The protection film 924b also functions as a planarization layer that suppresses the unevenness formed on the surface of the protection film 924a. At this time, the protection film 924b may be formed such that it can function as a lid for the isolating portions 920. More specifically, silicon oxide or silicon oxynitride is formed as the protection film 924b using, for example, CVD with a high growth rate, thereby forming a cavity in each isolating portion 920. Alternatively, a cavity can be formed in each isolating portion 920 by, for example, adjusting the viscosity of the resin such as acrylic resin to form the planarization layer 121 or a condition at the time of coating.

After the formation of the protection film 924b, the display device 1100 shown in FIG. 11 is formed using the same steps as those from FIG. 3C described above. As in the above-described embodiments, a material having a refractive index lower than that of the protection layer 116 may be embedded in the isolating portions 920. In this case, the material embedded in the isolating portions 920 may have a refractive index lower than that of the color filter layers 123.

In this embodiment as well, light diffused in the protection layer 116 is reflected by the interfaces between the protection layer 116 and the isolating portions 920, and light leakage between adjacent light emitting elements is suppressed. Additionally, in this embodiment, since light leakage between adjacent light emitting elements is suppressed even in the color filter layers 123, the quality of a displayed image can further be improved.

In this embodiment, the isolating portions 920 are formed continuously from the protection layer 116 to the color filter layers 123. However, the isolating portions may separately be provided for the protection layer 116 and the color filter layers 123. For example, after the same steps as those shown in FIGS. 2A to 3B are performed, isolating portions are formed in portions of the color filter layers 123 arranged above the portions 152 of the insulator portion 110. After that, the display device 1100 may be formed by performing the same steps as those from FIG. 3C.

Figure 15A:
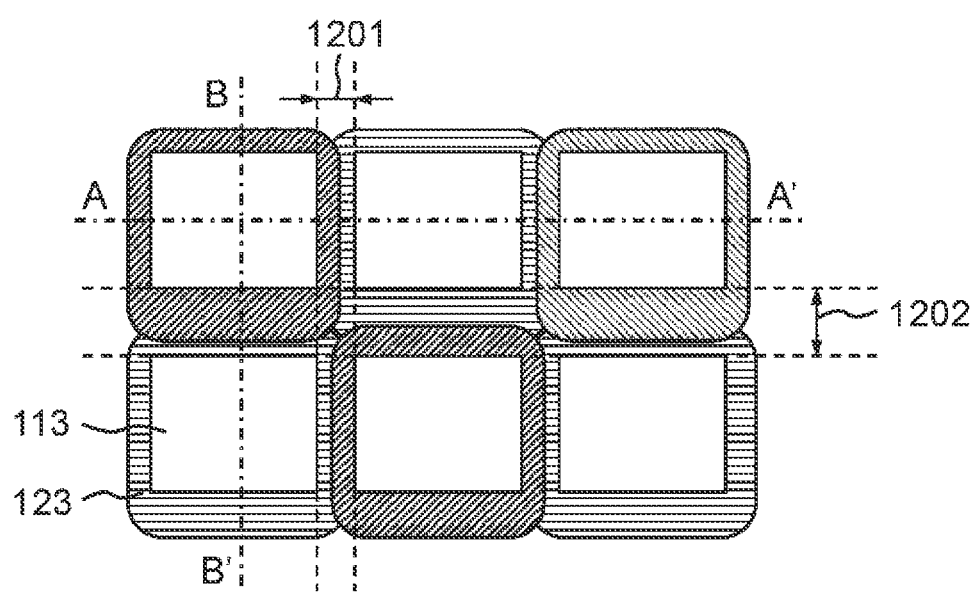
FIGS. 15A to 15C are plan and sectional views for explaining still another modification of the display device shown in FIG. 1.
Figure 15B:
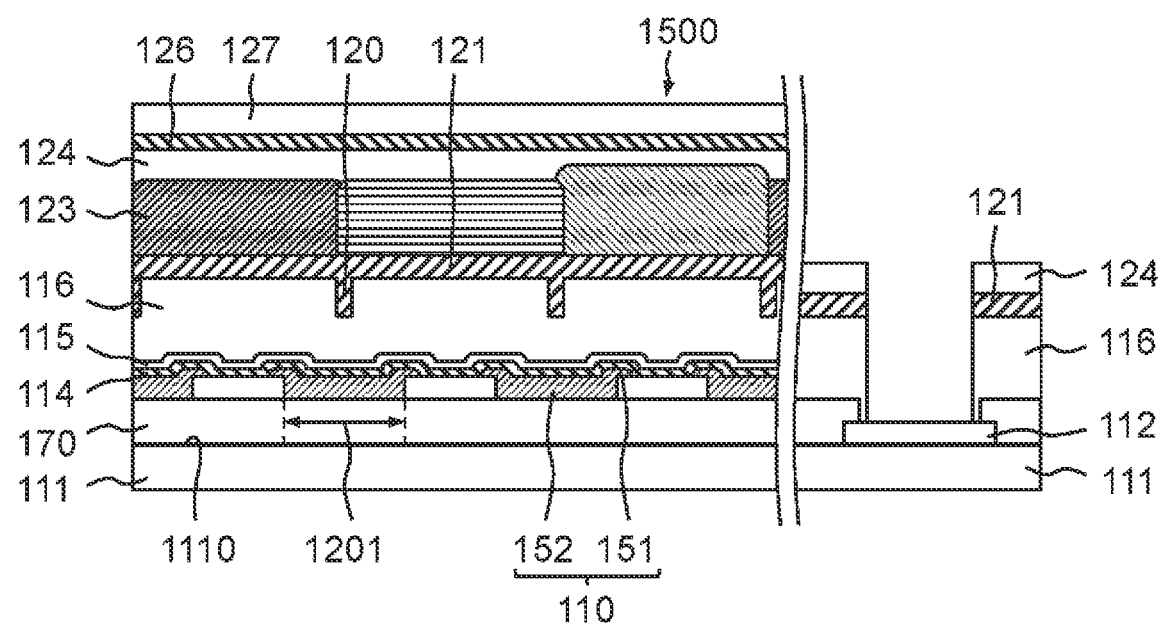
Figure 15C:
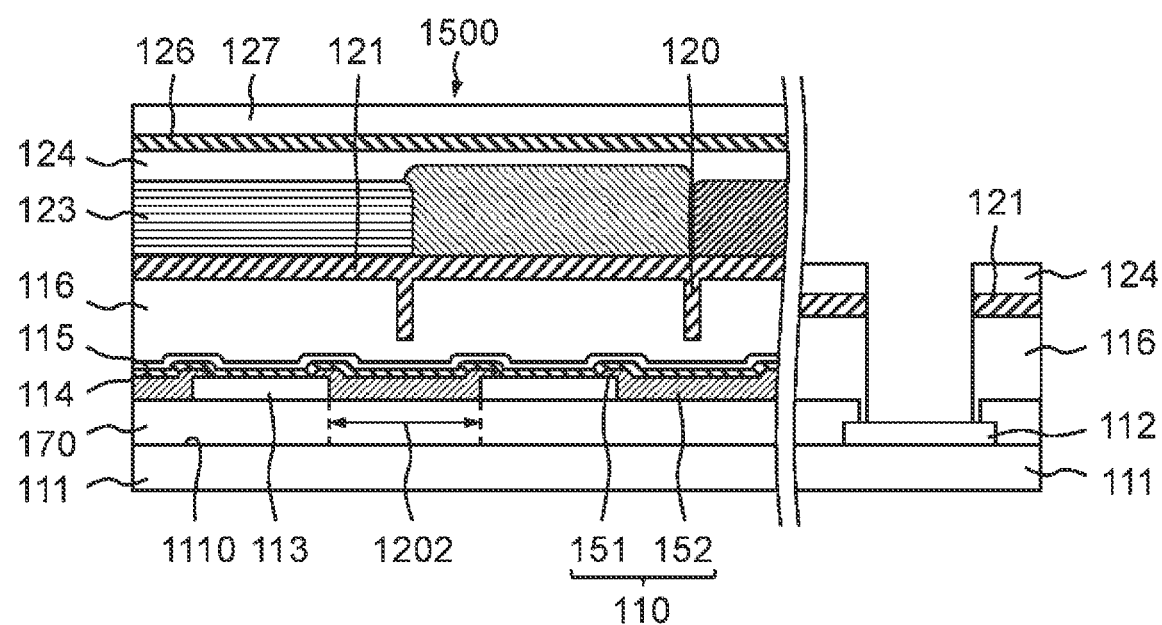

The arrangement of a display device according to still another embodiment of the present invention will be described with reference to FIGS. 15A to 15C. FIGS. 15A to 15C are plan and sectional views showing the arrangement of a display device 1500 according to a sixth embodiment of the present invention. This embodiment is different from the above-described first embodiment in that the height from a surface 1110 of a substrate 111 to the bottom surfaces of isolating portions 120 changes depending on the interval between lower electrodes 113 of adjacent light emitting elements. The rest may be the same as in the above-described first embodiment. For this reason, the arrangement from the substrate 111 to an upper electrode 115 of the display device 1500 can be the same as in the display device 100 according to the first embodiment shown in FIG. 1.

In this embodiment, as shown in FIG. 15A, in the light emitting elements arranged in an array, the interval to arrange the light emitting elements changes depending on the direction to arrange. Referring to FIG. 15A, in the light emitting elements, the lower electrodes 113 are arranged at an interval of a length 1201 in the horizontal direction, and are arranged at an interval of a length 1202 longer than the length 1201 in the vertical direction.

FIG. 15B shows a section taken along a line A-A' in FIG. 15A, and FIG. 15C shows a section taken along a line B-B'. In this embodiment, as shown in FIGS. 15B and 15C, with respect to the surface 1110 of the substrate 111, the height of the bottom surfaces of the isolating portions 120 in the portions where the interval between the adjacent lower electrodes 113 is narrow is larger than the height of the bottom surfaces of the isolating portions 120 in the portions where the interval between the adjacent lower electrodes 113 is wide. In other words, the depth of the isolating portions 120 arranged in the portions where the interval between the adjacent lower electrodes 113 is narrow may be made relatively smaller than the depth of the isolating portions 120 arranged in the portions where the interval between the adjacent lower electrodes 113 is wide.

For example, the height of the bottom surfaces of the isolating portions 120 may be determined such that the distances from portions of an organic layer 114 which are arranged on the lower electrodes 113 and emit light to the adjacent isolating portions 120 become almost constant independently of the interval to arrange the lower electrodes 113. Alternatively, for example, the distances from center portions of the lower electrodes 113 to the center portions of the bottom surfaces of the adjacent isolating portions 120 may be constant independently of the interval to arrange the lower electrodes 113. The height of the bottom surfaces of the isolating portions 120 is appropriately selected in accordance with the interval to arrange the lower electrodes 113, the thickness of a protection layer 116 in which the isolating portions 120 are formed, the shape of the isolating portions 120, or the like. Even in a case in which the interval between the lower electrodes 113 is narrow, and the distance from each isolating portion 120 to the portion of the organic layer 114 which is arranged on the lower electrode 113 and emits light is relatively short, it is possible to suppress entry of water via the isolating portions 120.

Additionally, in a case in which places where the interval of the lower electrodes 113 is wide and places where the interval is narrow exist, and the heights of the bottom surfaces of the isolating portions 120 from the surface 1110 of the substrate 111 are equal, light from adjacent light emitting elements readily enters light emitting elements for which the interval of the lower electrodes 113 is wide. However, when the height from the surface 1110 of the substrate 111 to the bottom surfaces of the isolating portions 120 is changed depending on the interval between the lower electrodes 113, as described above, it is possible to suppress entry of light from adjacent light emitting elements to other light emitting elements independently of the interval of the lower electrodes 113.

Six embodiments of the present invention have been described above. However, the present invention is not limited to these embodiments, and the above-described embodiments can appropriately be changed or combined without departing from the scope of the present invention. For example, in the display device 900 shown in FIG. 9, the bottom surfaces of the isolating portions 120 may be in contact with the upper electrode 115, as in the display device 500 shown in FIG. 5.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-237828, filed Dec. 7, 2016 which is hereby incorporated by reference wherein in its entirety.

What is claimed is:

1. A display device comprising:
a substrate;
light emitting elements arranged over a surface of the substrate;
a protection layer arranged to cover the light emitting elements; and
a color filter layer arranged above the protection layer,
wherein the light emitting elements include lower electrodes isolated from each other by an insulator portion, an organic layer including a light emitting layer arranged over the lower electrodes, and an upper electrode arranged to cover the organic layer, the protection layer is arranged to cover the upper electrode,
the protection layer is provided with an isolating portion that is arranged over and overlapped with the insulator portion in a planar view and has a refractive index different from that of the protection layer,
the isolating portion includes a trench extending from an upper surface of the protection layer toward the substrate, and
a depth of the trench is larger than a width of the trench.

2. The device according to claim 1, further comprising an interlayer dielectric film between the substrate, and the light emitting elements and the insulator portion,
wherein the lower electrodes and the insulator portion are arranged in contact with an upper surface of the interlayer dielectric film, and
the first portion covers a peripheral portion of each of the lower electrodes and does not cover a center portion of each of the lower electrodes.

3. The device according to claim 1, wherein the isolating portion is made of a material having a refractive index lower than that of the protection layer.

4. The device according to claim 1, wherein the protection layer includes a portion arranged between the isolating portion and the upper electrode.

5. The device according to claim 1, wherein the lower electrodes adjacent to each other in some of the light emitting elements are arranged at a first interval, and the lower electrodes adjacent to each other in another some of the light emitting elements are arranged at a second interval smaller than the first interval, and
with respect to the surface of the substrate, a height of a bottom surface of the isolating portion in the portion where the lower electrodes are arranged at the first interval is higher than the height of the bottom surface of the isolating portion in the portion where the lower electrodes are arranged at the second interval.

6. The device according to claim 1, wherein the isolating portion is in contact with an upper surface of the upper electrode.

7. The device according to claim 1, wherein the protection layer has a stacked structure including, from a side of the substrate, a first layer, a second layer including a material different from that of the first layer, and a third layer including a material different from that of the second layer, and
a bottom surface of the isolating portion and an upper surface of the second layer are in contact.

8. The device according to claim 7, wherein the first layer and the third layer include the same material.

9. The device according to claim 1, wherein the insulator portion includes a first portion arranged on each of the lower electrodes and a second portion arranged between the lower electrodes, and the organic layer is arranged over the lower electrodes and the second portion.

10. The device according to claim 1, wherein, with respect to the surface of the substrate, a height of an upper surface of a portion of the upper electrode arranged under the isolating portion is lower than a height of an upper surface of a portion of the upper electrode arranged over the first portion.

11. A display device comprising:
a substrate;
light emitting elements arranged over a surface of the substrate;
a protection layer arranged to cover the light emitting elements; and a color filter layer arranged above the protection layer,
wherein the light emitting elements include lower electrodes isolated from each other by an insulator portion, an organic layer that includes a light emitting layer and that is arranged over the lower electrodes and over a portion that is arranged between the lower electrodes and over the insulator portion, and an upper electrode arranged to cover the organic layer, the protection layer includes an isolating portion provided over and overlapped with a portion between the lower electrodes, the isolating portion is spaced apart from the upper electrode, the isolating portion includes a trench extending from an upper surface of the protection layer toward the substrate, and a depth of the trench is larger than a width of the trench.

12. The device according to claim 11, further comprising an interlayer dielectric film between the substrate and the light emitting elements and the insulator portion, wherein the lower electrodes and the insulator portion are arranged in contact with an upper surface of the interlayer dielectric film, and the insulator portion covers a peripheral portion of each of the lower electrodes and does not cover a center portion of each of the lower electrodes.

13. The device according to claim 11, wherein the isolating portion is made of a material having a refractive index lower than that of the protection layer.

14. The device according to claim 11, wherein the lower electrodes adjacent to each other in some of the light emitting elements are arranged at a first interval, and the lower electrodes adjacent to each other in another some of the light emitting elements are arranged at a second interval smaller than the first interval, and with respect to the surface of the substrate, a height of a bottom surface of the isolating portion in the portion where the lower electrodes are arranged at the first interval is higher than the height of the bottom surface of the isolating portion in the portion where the lower electrodes are arranged at the second interval.

15. The device according to claim 11, wherein the protection layer has a stacked structure including, from a side of the substrate, a first layer, a second layer including a material different from that of the first layer, and a third layer including a material different from that of the second layer, and a bottom surface of the isolating portion and an upper surface of the second layer are in contact.

16. The device according to claim 15, wherein the first layer and the third layer includes the same material.

17. The device according to claim 11, wherein the isolating portion is further provided over a portion of the color filter layer between the lower electrodes.

* * * * *